(12) United States Patent
Aikawa et al.

(10) Patent No.: US 10,867,650 B2
(45) Date of Patent: Dec. 15, 2020

(54) MAGNETIC STORAGE DEVICE

(71) Applicant: TOSHIBA MEMORY CORPORATION, Tokyo (JP)

(72) Inventors: Hisanori Aikawa, Yokohama Kanagawa (JP); Tatsuya Kishi, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/559,204

(22) Filed: Sep. 3, 2019

(65) Prior Publication Data

US 2020/0302985 A1    Sep. 24, 2020

(30) Foreign Application Priority Data

Mar. 18, 2019  (JP) .................... 2019-049540

(51) Int. Cl.
| | |
|---|---|
| *G11C 11/00* | (2006.01) |
| *G11C 11/16* | (2006.01) |
| *H01L 27/22* | (2006.01) |
| *H01L 43/02* | (2006.01) |

(52) U.S. Cl.
CPC ........ *G11C 11/161* (2013.01); *G11C 11/1657* (2013.01); *G11C 11/1659* (2013.01); *H01L 27/224* (2013.01); *H01L 43/02* (2013.01)

(58) Field of Classification Search
CPC .............. G11C 11/161; G11C 11/1652; G11C 11/1659; H01L 27/224; H01L 43/02
USPC .................................................. 365/158, 173
See application file for complete search history.

(56) References Cited

U.S. PATENT DOCUMENTS

| | | | |
|---|---|---|---|
| 6,552,926 B2 | 4/2003 | Komori | |
| 6,885,577 B2 | 4/2005 | Tang et al. | |
| 7,596,015 B2* | 9/2009 | Kitagawa | ............ B82Y 25/00 |
| | | | 365/158 |
| 8,218,355 B2* | 7/2012 | Kitagawa | ............ H01L 27/222 |
| | | | 365/158 |

(Continued)

FOREIGN PATENT DOCUMENTS

| | | |
|---|---|---|
| JP | 2007281502 A | 10/2007 |
| JP | 5383744 B2 | 1/2014 |

*Primary Examiner* — Viet Q Nguyen
(74) *Attorney, Agent, or Firm* — Kim & Stewart LLP

(57) ABSTRACT

A magnetic storage device includes a first and a second stacked body including a first ferromagnetic body and a second ferromagnetic body, respectively. A first magnetoresistive effect element includes the first ferromagnetic body and a third ferromagnetic body with a first nonmagnetic body between the first and third ferromagnetic bodies. A second magnetoresistive effect element includes the first ferromagnetic body and a fourth ferromagnetic body with a second nonmagnetic body between the first and fourth ferromagnetic bodies. A third magnetoresistive effect element includes the second ferromagnetic body and a fifth ferromagnetic body with a third nonmagnetic body between the second and fifth ferromagnetic bodies. A fourth magnetoresistive effect element includes the second ferromagnetic body and a sixth ferromagnetic body with a fourth nonmagnetic body between the second and sixth ferromagnetic bodies. The third and fourth ferromagnetic bodies are between the first and second stacked bodies.

20 Claims, 14 Drawing Sheets

(56) References Cited

U.S. PATENT DOCUMENTS

| | | | |
|---|---|---|---|
| 8,363,462 B2 * | 1/2013 | Nagase | G11C 11/1675 |
| | | | 365/158 |
| 8,994,131 B2 | 3/2015 | Shimomura et al. | |
| 10,103,318 B2 * | 10/2018 | Watanabe | H01L 43/10 |
| 10,388,343 B2 * | 8/2019 | Oikawa | G11C 11/1675 |
| 10,535,391 B2 * | 1/2020 | Osada | G11C 11/1673 |
| 10,707,269 B2 * | 7/2020 | Nagase | H01F 41/34 |
| 2017/0110508 A1 * | 4/2017 | Kim | H01L 43/10 |
| 2019/0221609 A1 * | 7/2019 | Aggarwal | H01L 23/5226 |
| 2019/0355896 A1 * | 11/2019 | Kim | G01R 33/098 |
| 2019/0355897 A1 * | 11/2019 | Sun | H01F 10/3268 |
| 2020/0075669 A1 * | 3/2020 | Chuang | H01L 43/12 |

* cited by examiner

MAGNETIC STORAGE DEVICE

CROSS-REFERENCE TO RELATED APPLICATION(S)

This application is based upon and claims the benefit of priority from Japanese Patent Application No. 2019-049540, filed Mar. 18, 2019, the entire contents of which are incorporated herein by reference.

FIELD

Embodiments described herein relate generally to a magnetic storage device.

BACKGROUND

A magnetic storage device, such as a magnetoresistive random access memory (MRAM), using a magnetoresistive effect element as a storage element is known.

DETAILED DESCRIPTION

Figure 1:
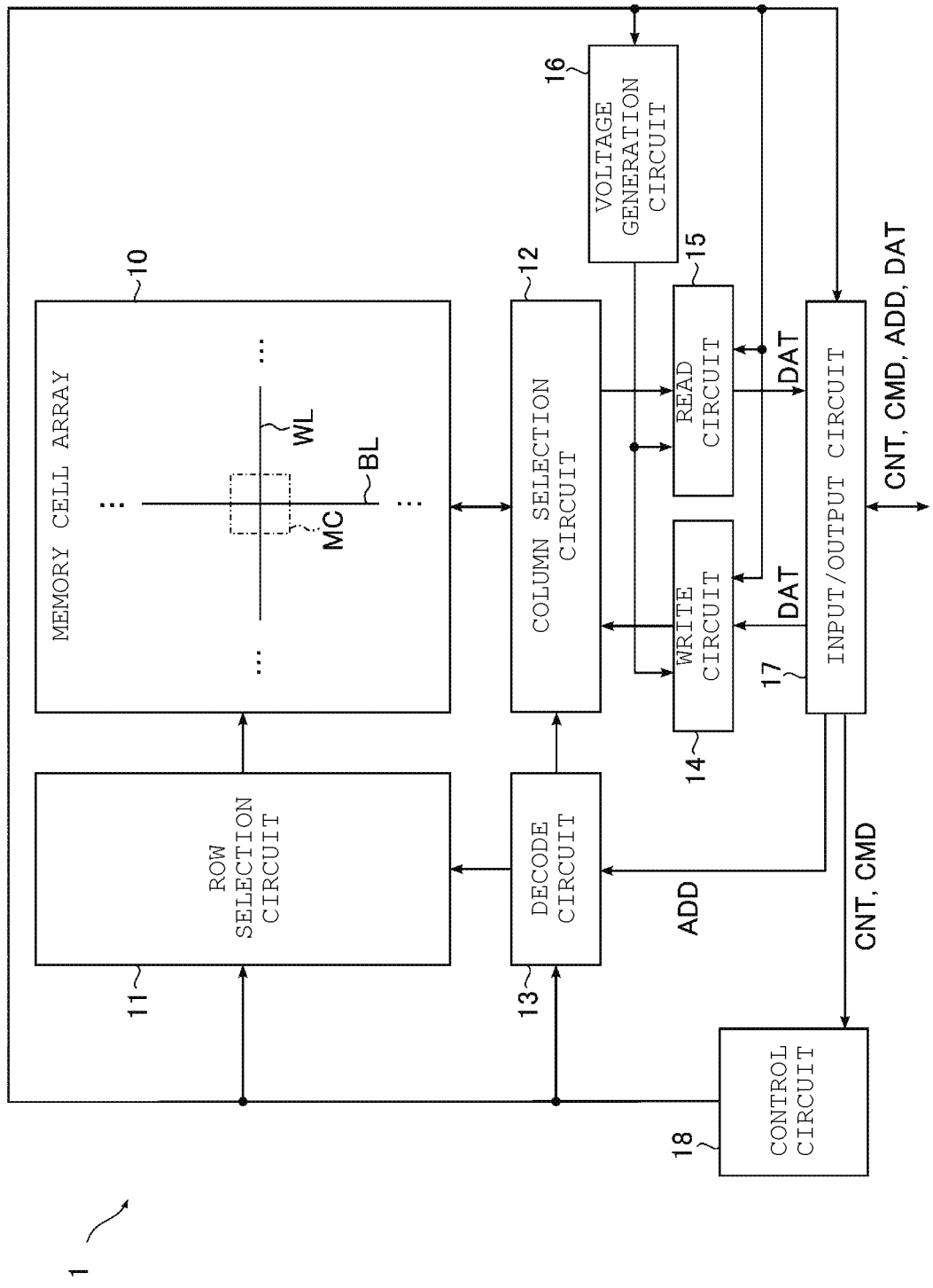
FIG. 1 is a block diagram of a magnetic storage device according to a first embodiment.

In general, according to one embodiment, a magnetic storage device includes a first stacked body extending in a first direction and second stacked body extending in a second direction. The first stacked body includes a first ferromagnetic body, and the second stacked body includes a second ferromagnetic body. A first magnetoresistive effect element comprises the first ferromagnetic body, a third ferromagnetic body, and a first nonmagnetic body between the first ferromagnetic body and the third ferromagnetic body. A second magnetoresistive effect element, which is spaced from the first magnetoresistive effect element in the first direction, comprises the first ferromagnetic body, a fourth ferromagnetic body, and a second nonmagnetic body between the first ferromagnetic body and the fourth ferromagnetic body. A third magnetoresistive effect element comprises the second ferromagnetic body, a fifth ferromagnetic body, and a third nonmagnetic body between the second ferromagnetic body and the fifth ferromagnetic body. A fourth magnetoresistive effect element, which is spaced from the third magnetoresistive effect element in the second direction, comprises the second ferromagnetic body, a sixth ferromagnetic body, and a fourth nonmagnetic body between the second ferromagnetic body and the sixth ferromagnetic body. The third ferromagnetic body and the fourth ferromagnetic body are between the first stacked body and the second stacked body in a stacking direction of the first stacked body and the second stacked body. The second stacked body is between the third ferromagnetic body and the fourth ferromagnetic body and also between the fifth ferromagnetic body and the sixth ferromagnetic body in the stacking direction.

Hereinafter, example embodiments will be described with reference to drawings. In the following description, constituent elements having the same function and configuration are denoted by the same reference numerals and symbols. When there is a plurality of constituent elements having a common reference symbol, different elements within the plurality may be distinguished from each other when necessary, by adding distinguishing suffixes to the common reference sign. When there is no need to distinguish between different members of a plurality of constituent elements, then only the common reference symbol is used, and suffixes are not added thereto. In this context, added suffixes may be subscripts, superscripts, or lower case alphabetic letters, ordinal (sequencing) indexing numbers preceded by an underscore added to the end of the common reference symbol.

1. First Embodiment

A magnetic storage device according to a first embodiment will be described. The magnetic storage device according to the first embodiment is, for example, a anisotropic perpendicular magnetization-type magnetic storage device including an element having a magnetoresistive effect by a magnetic tunnel junction (MTJ) as a resistance-variable element. The element may also be referred to as a MTJ element in some contexts.

1.1 Configuration

First, the configuration of the magnetic storage device according to the first embodiment will be described.

1.1.1 Configuration of Magnetic Storage Device

FIG. 1 is a block diagram showing a configuration of the magnetic storage device according to the first embodiment. As shown in FIG. 1, a magnetic storage device 1 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC each associated with a row and a column. The memory cells MC in the same row are connected to the same word line WL, and the memory cells MC in the same column are connected to the same bit line BL.

The row selection circuit 11 is connected to the memory cell array 10 via the word line WL. The decoding result (row address) of an address ADD from the decode circuit 13 is supplied to the row selection circuit 11. The row selection circuit 11 sets the word line WL corresponding to the row of the address ADD to a selected state. Hereinafter, a word line WL in the selected state is referred to as a selected word line WL. The word lines WL other than the selected word line WL are referred to as non-selected word lines WL.

The column selection circuit 12 is connected to the memory cell array 10 via the bit line BL. The decoding result (column address) of the address ADD from the decode circuit 13 is supplied to the column selection circuit 12. The column selection circuit 12 sets a column of the address ADD to a selected state. Hereinafter, a bit line BL in a selected state is referred to as a selected bit line BL. The bit lines BL other than the selected bit line BL are referred to as non-selected bit lines BL.

The decode circuit 13 decodes the address ADD received from the input/output circuit 17. The decode circuit 13 supplies the decoding result of the address ADD to the row selection circuit 11 and the column selection circuit 12. The address ADD includes a column address and a row address of a memory cell MC to be selected.

The write circuit 14 writes data to the memory cells MC. The write circuit 14 includes, for example, a write driver (not separately depicted).

The read circuit 15 reads data from the memory cell MC. The read circuit 15 includes, for example, a sense amplifier (not separately depicted).

The voltage generation circuit 16 generates voltages for various operations of the memory cell array 10 by using a power supply voltage provided from the outside of the magnetic storage device 1. For example, the voltage generation circuit 16 generates various voltages necessary for write operations and outputs the generated voltages to the write circuit 14. Also, for example, the voltage generation circuit 16 generates various voltages necessary for read operations and outputs the generated voltages to the read circuit 15.

The input/output circuit 17 transfers the address ADD received from the outside of the magnetic storage device 1 to the decode circuit 13. The input/output circuit 17 transfers a command CMD received from the outside of the magnetic storage device 1 to the control circuit 18. The input/output circuit 17 transmits and receives various control signals CNT between the outside of the magnetic storage device 1 and the control circuit 18. The input/output circuit 17 transfers data DAT received from the outside of the magnetic storage device 1 to the write circuit 14 and outputs the data DAT transferred from the read circuit 15 to the outside of the magnetic storage device 1.

The control circuit 18 controls the operations of the row selection circuit 11, the column selection circuit 12, the decode circuit 13, the write circuit 14, the read circuit 15, the voltage generation circuit 16, and the input/output circuit 17 based on the control signals CNT and the commands CMD.

1.1.2 Configuration of Memory Cell Array

Figure 2:
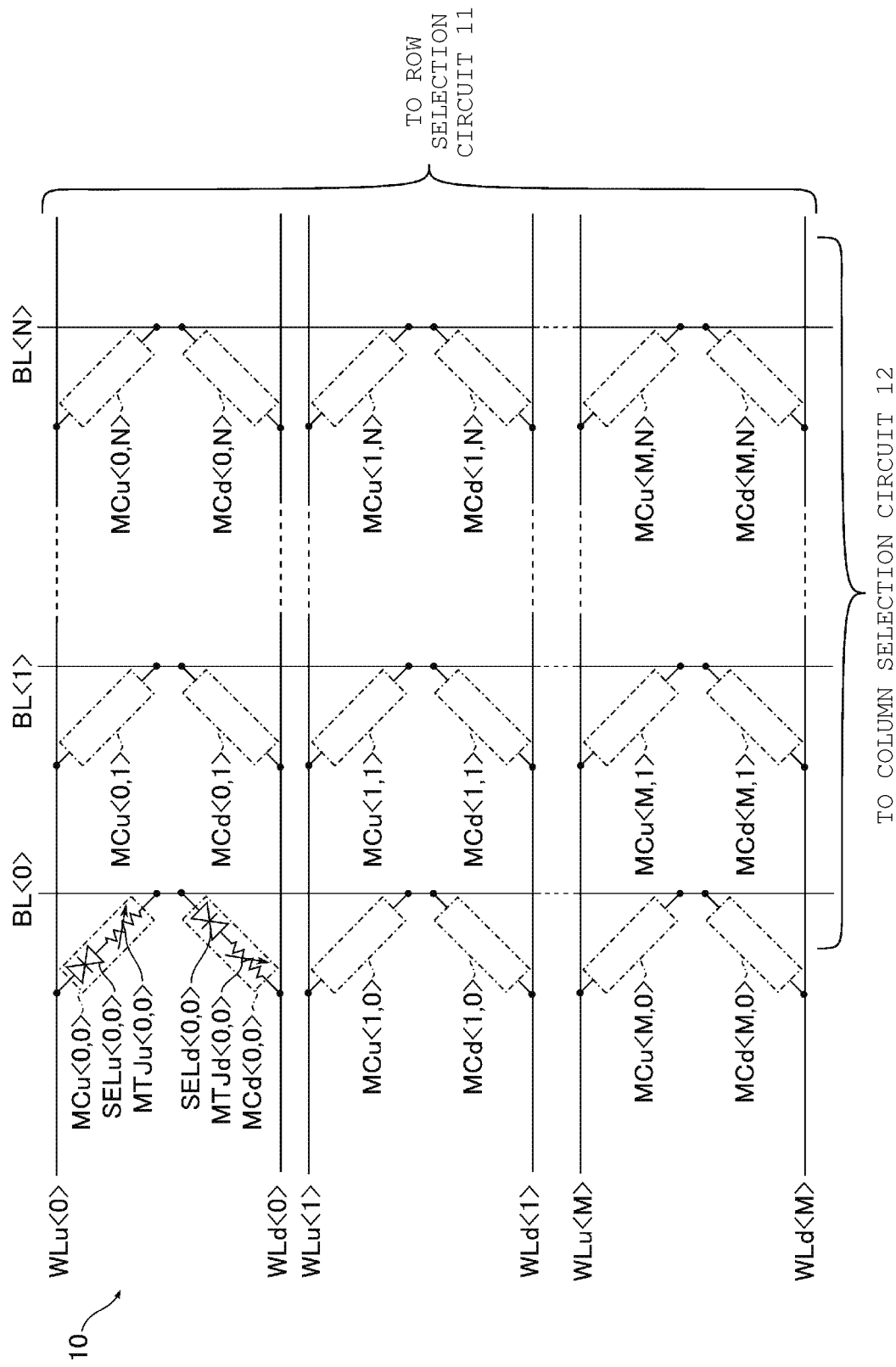
FIG. 2 is a circuit diagram of a memory cell array of a magnetic storage device according to a first embodiment.

FIG. 2 is a circuit diagram showing a configuration of the memory cell array of the magnetic storage device according to the first embodiment. In FIG. 2, different word lines WL are further classified by suffixes including one of two lower case alphabetic letters ("u" and "d") and an index value ("<#>").

As shown in FIG. 2, the memory cells MC (that is memory cells MCu and MCd) are arranged in a matrix configuration in the memory cell array 10 and are each associated with a one of a plurality of bit lines BL (BL<0>, BL<1> . . . BL<N>) and a respective one of a plurality of word lines WLd (WLd<0>, WLd<1> . . . WLd<M>) or a plurality of word lines WLu (WLu<0>, WLu<1> . . . WLu<M>) (where M and N are integers). That is, a memory cell MCd<i, j> (0≤i≤M, 0≤j≤N) is connected between a word line WLd<i> and a bit line BL<j>, and a memory cell MCu<i, j> is connected between a word line WLu<i> and a bit line BL<j>.

The suffixes "d" and "u" respectively identify a memory cell that is provided below ("d") and a memory cell provided that is above ("u") for example, a bit line BL. However, "above" and "below" in this context are merely description of relative positioning of these elements adopted for explanatory convenience without intending to necessarily correspond to a direction of gravity or the like. An example of the three-dimensional structure of the memory cell array 10 will be described later.

The memory cell MCd<i, j> includes a selector SELd<i, j> and a magnetoresistive effect element MTJd<i, j> connected in series. The memory cell MCu<i, j> includes a selector SELu<i, j> and a magnetoresistive effect element MTJu<i, j> connected in series.

A selector SEL functions as a switch that controls the supply of a current to the connected magnetoresistive effect element MTJ when data is written to and read from the corresponding magnetoresistive effect element MTJ. More specifically, the selector SEL in a particular memory cell MC shuts off the current by acting as an insulator having a large resistance when the voltage applied to the memory cell MC falls below a threshold voltage Vth, and allows a current to flow by acting as a conductor having a low resistance when the voltage applied to the memory cell MC exceeds the threshold voltage Vth. That is, the selector SEL "turns on" and "turns off" by permitting a current to flow or not according to the magnitude of the voltage applied to the memory cell MC regardless of the direction of the flowing current.

The selector SEL may be, for example, a two-terminal switching element. When the voltage applied between the two terminals is equal to or lower than a threshold voltage, the switching element is in a "high resistance" state that can be considered an electrically non-conductive state. When the voltage applied across the two terminals is equal to or greater than the threshold voltage, the switching element changes into a "low resistance" state that can be considered an electrically conductive state. The switching element may have this function regardless of polarity of the voltage applied thereto. For example, the switching element may comprise at least one chalcogen element selected from the group consisting of tellurium (Te), selenium (Se), and sulfur (S). Alternatively, the switching element may comprise a chalcogenide which is a compound containing at least one of the above chalcogen elements. In addition to the above, the switching element may comprise at least one element selected from the group consisting of boron (B), aluminum (Al), gallium (Ga), indium (In), carbon (C), silicon (Si), germanium (Ge), tin (Sn), arsenic (As), phosphorus (P), antimony (Sb), titanium (Ti), and bismuth (Bi). More specifically, the switching element may comprise at least two elements selected from the group of germanium (Ge), antimony (Sb), tellurium (Te), titanium (Ti), arsenic (As), indium (In), and bismuth (Bi). Furthermore, in addition to the above, the switching element may comprise an oxide of at least one element selected from titanium (Ti), vanadium (V), chromium (Cr), niobium (Nb), molybdenum (Mo), hafnium (Hf), and tungsten (W).

The magnetoresistive effect element MTJ may switch between a low resistance state and a high resistance state by a current whose supply is controlled by the selector SEL. The magnetoresistive effect element MTJ may record data as a change in resistance state, store data in a nonvolatile manner, and function as a readable storage element.

Figure 3:
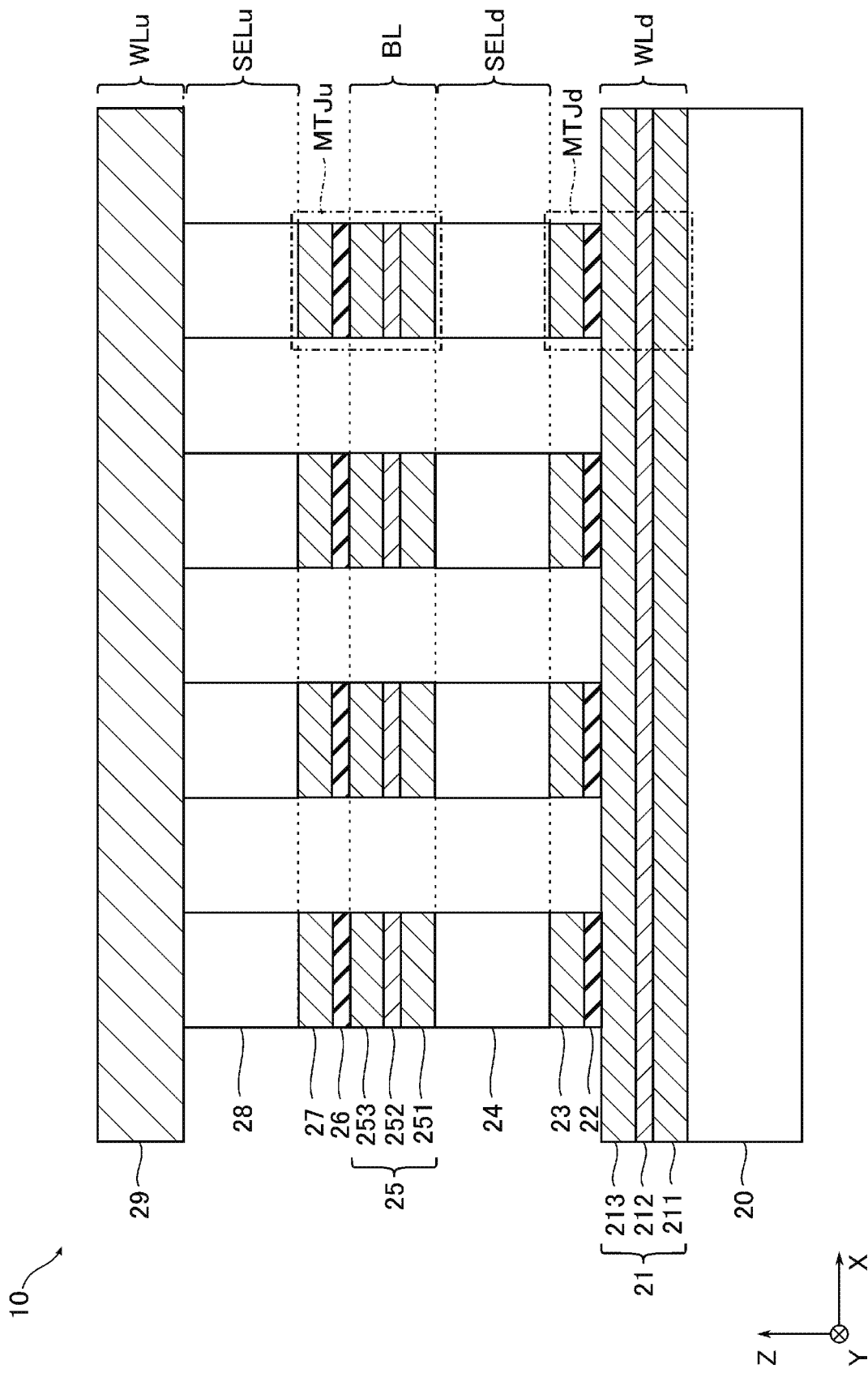
FIG. 3 is a cross-sectional view s of a memory cell array of a magnetic storage device according to a first embodiment.
Figure 4:
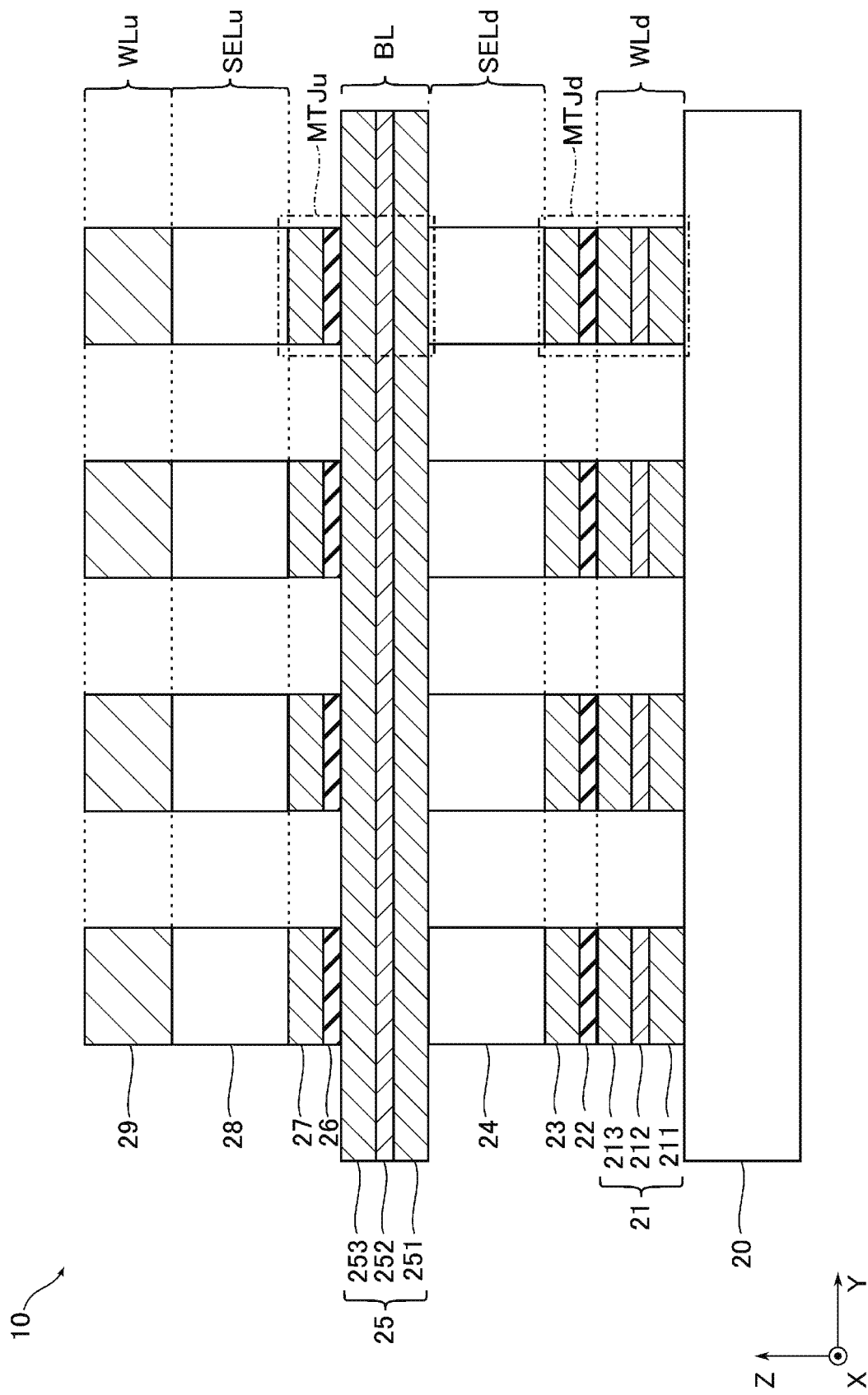
FIG. 4 is another cross-sectional view of a memory cell array of a magnetic storage device according to a first embodiment.

FIGS. 3 and 4 show examples of a cross-sectional view showing the configuration of the memory cell array of the magnetic storage device according to the first embodiment. FIGS. 3 and 4 are cross-sectional views of the memory cell array 10 as viewed in different directions crossing each other.

As shown in FIGS. 3 and 4, the memory cell array 10 is provided on a semiconductor substrate 20. In the following description, a plane parallel to the surface of the semiconductor substrate 20 is taken as an XY plane, and a direction perpendicular to the XY plane is taken as a Z direction. Further, the direction along the length of the word lines WL is taken as an X direction, and the direction along the length of bit lines BL is taken as a Y direction. That is, FIGS. 3 and 4 are cross-sectional views of the memory cell array 10 as viewed in the Y direction and the X direction, respectively.

For example, a plurality of stacked bodies 21 is provided on an upper surface of the semiconductor substrate 20. The stacked bodies 21 are conductive and function as word lines WLd. For example, the stacked bodies 21 are provided side by side along the Y direction, and each extends along the X direction. While FIGS. 3 and 4 illustrate the case where the stacked bodies 21 are provided directly on the semiconductor substrate 20, the present disclosure is not limited thereto. For example, the stacked bodies 21 may be provided without being in contact with the semiconductor substrate 20 or may extend lengthwise orthogonally from the plane of the semiconductor substrate 20.

Each of the stacked bodies 21 is formed by stacking at least three layers of conductive materials. More specifically, for example, in each of the stacked bodies 21, a ferromagnetic body 211, a nonmagnetic body 212, and a ferromagnetic body 213 are stacked in this order from the semiconductor substrate 20 side. Each of the stacked bodies 21 shares a portion of each of the magnetoresistive effect elements MTJd arranged along the X direction and also functions as a portion of magnetoresistive effect elements MTJd.

On an upper surface of a stacked body 21, a plurality of nonmagnetic bodies 22 having insulating properties are provided side by side along the X direction, for example. That is, the plurality of nonmagnetic bodies 22 arranged along the X direction is commonly connected onto the ferromagnetic body 213 in one stacked body 21. A ferromagnetic body 23 is provided on an upper surface of each of the nonmagnetic bodies 22. A nonmagnetic body 22 and a ferromagnetic body 23 stacked on each other functions as a portion of a magnetoresistive effect element MTJd.

That is, the ferromagnetic body 23, the nonmagnetic body 22, and at least a portion of the stacked body 21 in contact with the nonmagnetic body 22 functions as a magnetoresistive effect element MTJd. Details of the magnetoresistive effect element MTJd will be described later.

An element 24 functioning as a selector SELd is provided on an upper surface of each ferromagnetic body 23. An upper surface of each of the elements 24 is connected to one of the stacked bodies 25. The stacked bodies 25 are conductive and function as bit lines BL. For example, the stacked bodies 25 are provided side by side along the X direction and each extend along the Y direction. That is, the plurality of elements 24 arranged along the Y direction is commonly connected to one stacked body 25. While FIG. 3 and FIG. 4 illustrate the case where each of the elements 24 is provided directly contacting the ferromagnetic body 23 and the stacked body 25, the present disclosure is not limited thereto. For example, each of the elements 24 may be connected to the ferromagnetic body 23 and the stacked body 25 via a conductive contact or the like.

Each of the stacked bodies 25 is formed by stacking at least three layers of conductive materials. More specifically, for example, in each of the stacked bodies 25, a ferromagnetic body 251, a nonmagnetic body 252, and a ferromagnetic body 253 are stacked in this order from the semiconductor substrate 20 side. Each of the stacked bodies 25 shares a portion of each of the magnetoresistive effect elements MTJu arranged along the Y direction and also functions as a portion of each of the magnetoresistive effect elements MTJu.

On an upper surface of one stacked body 25, a plurality of nonmagnetic bodies 26 having insulating properties are provided side by side along the Y direction, for example. That is, the plurality of nonmagnetic bodies 26 arranged along the Y direction is commonly connected to the ferromagnetic body 253 in one stacked body 25. A ferromagnetic body 27 is provided on an upper surface of each of the nonmagnetic bodies 26. A nonmagnetic body 26 and a ferromagnetic body 27 stacked one on each other functions as a portion of a magnetoresistive effect element MTJu.

That is, the ferromagnetic body 27, the nonmagnetic body 26, and at least a portion of the stacked body 25 in contact with the nonmagnetic body 26 function as a magnetoresistive effect element MTJu. Details of the magnetoresistive effect element MTJu will be described later.

An element 28 functioning as a selector SELu is provided on an upper surface of each of a plurality of ferromagnetic bodies 27. An upper surface of each of the elements 28 is connected to one of a plurality of conductors 29. The plurality of conductors 29 function as the word lines WLu. For example, the plurality of conductors 29 are provided side by side along the Y direction, and each extend along the X direction. That is, the plurality of elements 28 arranged along the X direction is commonly connected to one conductor 29. While FIGS. 3 and 4 illustrate the case where each element 28 is provided directly on a ferromagnetic body 27 and a conductor 29, the present disclosure is not limited thereto. For example, each o element 28 may be connected to the ferromagnetic body 27 and the conductor 29 via a conductive contact.

By being configured as described above, the memory cell array 10 has a structure in which a set of two word lines WLd and WLu corresponds to one bit line BL. The memory cell array 10 has a structure in which the memory cell MCd is provided between the word line WLd and the bit line BL, and the memory cell MCu is provided between the bit line BL and the word line WLu. In the structure in which the memory cells MC are provided at different heights/levels along the Z direction as shown in FIGS. 3 and 4, the memory cell MCd is associated with the lower layer, and the memory cell MCu is associated with the upper layer. That is, among the two memory cells MC commonly connected to one bit line BL, the memory cell MC provided on the upper surface of the bit line BL corresponds to the memory cell MCu (having the suffix "u"), and the memory cell MC provided on the lower surface corresponds to the memory cell MCd (having the suffix "d").

1.1.3 Configuration of Magnetoresistive Effect Element

Figure 5:
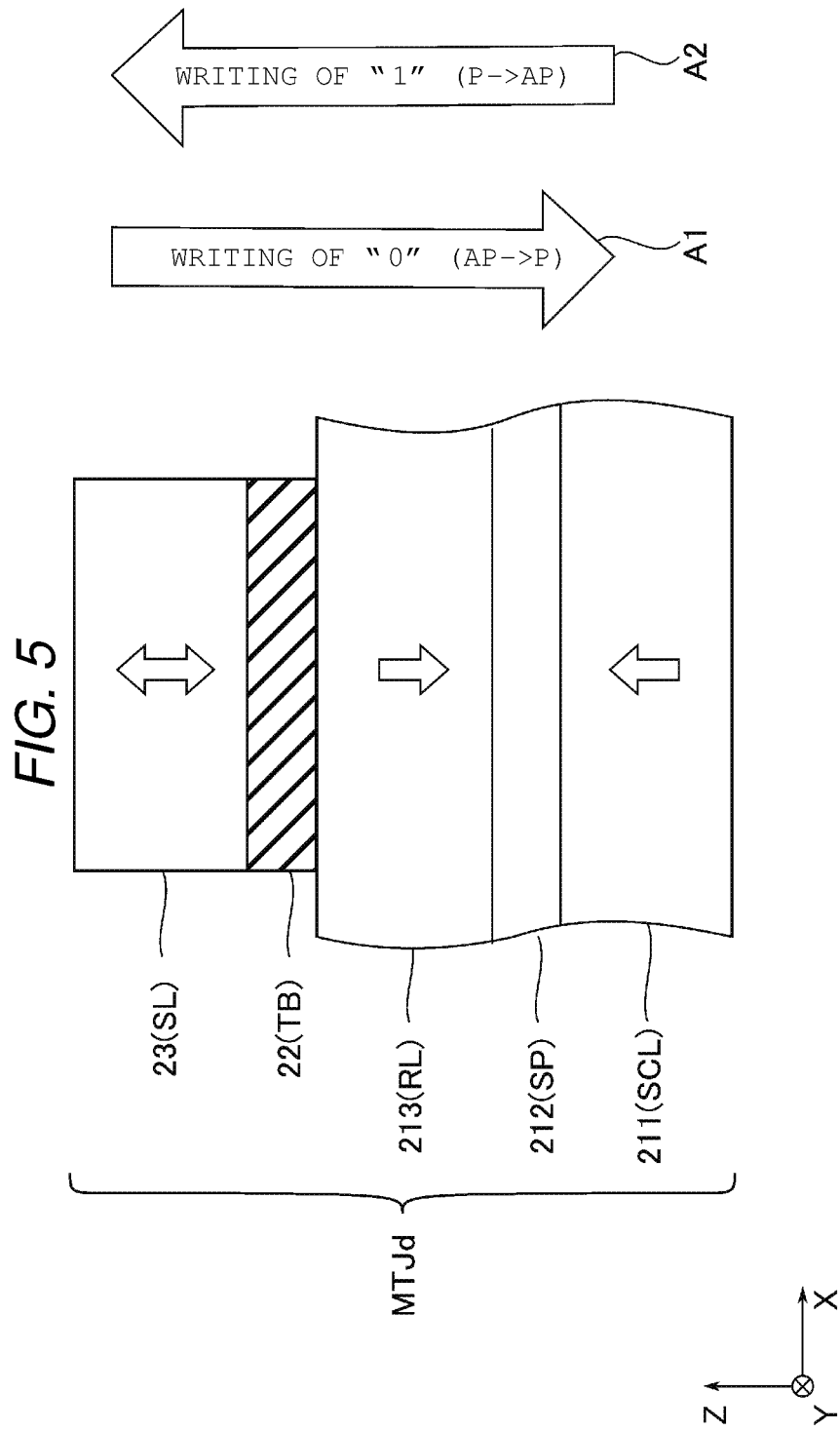
FIG. 5 is a cross-sectional view of a magnetoresistive effect element of a magnetic storage device according to a first embodiment.

Next, the configuration of the magnetoresistive effect element of the magnetic storage device according to the first embodiment will be described with reference to FIG. 5. FIG. 5 is a cross-sectional view showing the configuration of the magnetoresistive effect element of the magnetic storage device according to the first embodiment. In FIG. 5, for example, an example of a cross section of the magnetoresistive effect element MTJd including a part of the stacked body 21 (the ferromagnetic body 211, the nonmagnetic body 212, and the ferromagnetic body 213), the nonmagnetic body 22, and the ferromagnetic body 23) shown in FIGS. 3 and 4 along XZ plane perpendicular to the Z direction is shown. Since the magnetoresistive effect element MTJu has the same configuration as that of the magnetoresistive effect element MTJd, the illustration thereof is omitted.

As shown in FIG. 5, the magnetoresistive effect element MTJd includes the ferromagnetic body 23 functioning as a storage layer SL, the nonmagnetic body 22 functioning as a tunnel barrier layer TB, the ferromagnetic body 213 functioning as a reference layer RL, the nonmagnetic body 212 functioning as a spacer layer SP, and the ferromagnetic body 211 functioning as a shift cancelling layer SCL.

In the magnetoresistive effect element MTJd, a plurality of materials are stacked in the order of the ferromagnetic body 211, the nonmagnetic body 212, the ferromagnetic body 213, the nonmagnetic body 22, and the ferromagnetic body 23, from the word line WLd side to the bit line BL side (in the Z-axis direction), for example. In the magnetoresistive effect element MTJu, a plurality of materials are stacked in the order of the ferromagnetic body 251, the nonmagnetic body 252, the ferromagnetic body 253, the nonmagnetic body 26, and the ferromagnetic body 27, from the bit line BL side to the word line WLu side (in the Z-axis direction), for example. The magnetoresistive effect elements MTJd and MTJu function as, for example, perpendicular magnetization-type MTJ elements in which the magnetization directions of the magnetic bodies constituting the magnetoresistive effect elements MTJd and MTJu are respectively perpendicular to the film surface.

The ferromagnetic body 23 has ferromagnetism and an easy magnetization axis direction in the direction perpendicular to the film surface. The ferromagnetic body 23 has a magnetization direction toward either of the bit line BL side or the word line WLd side. The ferromagnetic body 23 contains, for example, cobalt iron boron (CoFeB) or iron boride (FeB), and may have a crystal structure of a body-centered cubic (bcc) system.

The nonmagnetic body 22 is a nonmagnetic insulating film and includes, for example, magnesium oxide (MgO). The nonmagnetic body 22 is provided between the ferromagnetic body 23 and the ferromagnetic body 213. Thereby, the ferromagnetic body 23, the nonmagnetic body 22, and the ferromagnetic body 213 constitute a magnetic tunnel junction.

The ferromagnetic body 213 has ferromagnetism and an easy magnetization axis direction in the direction perpendicular to the film surface. The ferromagnetic body 213 has a magnetization direction toward any of the bit line BL side and the word line WLd side. The ferromagnetic body 213 includes, for example, cobalt iron boron (CoFeB) or iron boride (FeB). The magnetization direction of the ferromagnetic body 213 is fixed, and in the example of FIG. 5, is directed to the direction of the ferromagnetic body 211. "The magnetization direction is fixed" means that the magnetization direction does not change due to a current (spin torque) of a magnitude that can reverse the magnetization direction of the ferromagnetic body 23.

Although not shown in FIG. 5, the ferromagnetic body 213 may be a stacked body including a plurality of layers. Specifically, the ferromagnetic body 213 may have a structure in which an additional ferromagnetic body is stacked on the surface of the above-described layer on the ferromagnetic body 211 side via the nonmagnetic conductor. The nonmagnetic conductor in the stacked body constituting the ferromagnetic body 213 may include, for example, at least one metal selected from tantalum (Ta), hafnium (Hf), tungsten (W), zirconium (Zr), molybdenum (Mo), niobium (Nb), and titanium (Ti). The additional ferromagnetic body in the stacked body constituting the ferromagnetic body 213 may include, for example, at least one artificial lattice selected from a multilayer film (Co/Pt multilayer film) of cobalt (Co) and platinum (Pt), a multilayer film (Co/Ni multilayer film) of cobalt (Co) and nickel (Ni), and a multilayer film (Co/Pd multilayer film) of cobalt (Co) and palladium (Pd).

The nonmagnetic body 212 is a nonmagnetic conductive film and includes, for example, at least one element selected from ruthenium (Ru), osmium (Os), iridium (Ir), vanadium (V), and chromium (Cr).

The ferromagnetic body 211 has ferromagnetism and an easy magnetization axis direction in the direction perpendicular to the film surface. The ferromagnetic body 211 contains, for example, at least one alloy selected from cobalt-platinum (CoPt), cobalt-nickel (CoNi), and cobalt-palladium (CoPd). Similar to the ferromagnetic body 213, the ferromagnetic body 211 may be a stacked body including a plurality of layers. In that case, the ferromagnetic body 211 may include, for example, at least one artificial lattice selected from a multilayer film (Co/Pt multilayer film) of cobalt (Co) and platinum (Pt), a multilayer film (Co/Ni multilayer film) of cobalt (Co) and nickel (Ni), and a multilayer film (Co/Pd multilayer film) of cobalt (Co) and palladium (Pd).

The ferromagnetic body 211 has a magnetization direction toward either of the bit line BL side or the word line WLd side. The magnetization direction of the ferromagnetic body 211 is fixed.

The ferromagnetic bodies 213 and 211 are antiferromagnetically coupled to each other by the nonmagnetic body 212. That is, the ferromagnetic bodies 213 and 211 are coupled so as to have magnetization directions antiparallel to each other. Therefore, in the example of FIG. 5, the magnetization direction of the ferromagnetic body 213 is directed to the direction of the ferromagnetic body 211. Such a coupled structure of the ferromagnetic body 213, the nonmagnetic body 212, and the ferromagnetic body 211 is referred to as a synthetic anti-ferromagnetic (SAF) structure. Thereby, the ferromagnetic body 211 may reduce or substantially offset the influence of the stray field of the ferromagnetic body 213 on the magnetization direction of the ferromagnetic body 23. For this reason, it is possible to prevent the occurrence of asymmetry in the ease with which the magnetization of the ferromagnetic body 23 is reversed due to an external factor caused by the stray field of the ferromagnetic body 213 or the like (that is, the ease with which the direction of magnetization of the ferromagnetic body 23 is reversed differs between when reversed from one to the other and when reversed in the opposite direction).

In order for the ferromagnetic body 211 to reduce or offset the stray field of the ferromagnetic body 213, it is desirable that at least the ferromagnetic body 211 has a magnetization equal to or larger than that of the ferromagnetic body 213. For this reason, it is desirable that the film thickness of the ferromagnetic body 211 is equal to or larger than the film thickness of the ferromagnetic body 213. Similarly, it is desirable that the film thickness of the ferromagnetic body 251 is equal to or larger than the film thickness of the ferromagnetic body 253.

In the first embodiment, a spin injection writing method is employed in which a write current is supplied directly to the magnetoresistive effect element MTJ, and a spin torque is injected to the storage layer SL and the reference layer RL by the write current to control the magnetization direction of the storage layer SL and the magnetization direction of the reference layer RL. The magnetoresistive effect element MTJ may take either the low resistance state or the high resistance state depending on whether the relative relationship between the magnetization directions of the storage layer SL and the reference layer RL is parallel or antiparallel.

When a write current Iw0 of a certain magnitude is supplied to the magnetoresistive effect element MTJ in the direction of the arrow A1 in FIG. 5, that is, from the storage layer SL to the reference layer RL, the relative relationship between the magnetization directions of the storage layer SL and the reference layer RL is parallel. In the parallel state, the resistance value of the magnetoresistive effect element MTJ is the lowest, and the magnetoresistive effect element MTJ is set to the low resistance state. This low resistance state is called "P (Parallel) state" and is defined as, for example, a state of data "0".

When a write current Iw1 larger than the write current Iw0 is supplied to the magnetoresistive effect element MTJ in the direction of the arrow A2 in FIG. 5, that is, from the reference layer RL to the storage layer SL, the relative relationship between the magnetization directions of the storage layer SL and the reference layer RL is antiparallel. In this antiparallel state, the resistance value of the magnetoresistive effect element MTJ is the highest, and the magnetoresistive effect element MTJ is set to the high resistance state. This high resistance state is called an "AP (Anti-Parallel) state" and is defined as, for example, a state of data "1".

The way of defining data "1" and data "0" is not limited to the example described above. For example, the P state may be defined as data "1", and the AP state may be defined as data "0".

1.2 Effects of Present Embodiment

According to the first embodiment, the magnetic storage device 1 includes a plurality of magnetoresistive effect elements MTJd connected between the word line WLu and the bit line BL, and a plurality of magnetoresistive effect elements MTJu connected between the bit line BL and the word line WLu. Thus, the set of the word lines WL and the bit lines BL may constitute the memory cell array 10 having a structure capable of uniquely selecting each magnetoresistive effect element MTJ located therein. In addition, with such a configuration, the memory cells MC may be provided at different heights in the direction (Z direction) perpendicular to the semiconductor substrate 20, thereby improving the integration density as compared to the case where the memory cells MC are all arranged only along the semiconductor substrate 20.

The stacked body 21 includes the ferromagnetic body 211, the nonmagnetic body 212, and the ferromagnetic body 213 sequentially stacked from the semiconductor substrate 20 side to form a SAF structure. The ferromagnetic body 213, the nonmagnetic body 22, and the ferromagnetic body 23 are stacked in this order from the semiconductor substrate 20 side to form a magnetic tunnel junction. Thus, one stacked body 21 may function as the reference layer RL, the spacer layer SP, and the shift cancelling layer SCL of each of the plurality of magnetoresistive effect elements MTJd arranged along the X direction. The stacked body 21 extends in the X direction across a plurality of magnetoresistive effect elements MTJd arranged along the X direction and also functions as a word line WLd. Therefore, the cross-sectional area of the stacked body 21 along the semiconductor substrate 20 may be larger than the cross-sectional area of the ferromagnetic body 23 and the nonmagnetic body 22.

Similarly, the bit line BL includes the ferromagnetic body 251, the nonmagnetic body 252, and the ferromagnetic body 253 sequentially stacked from the semiconductor substrate 20 side to form a SAF structure. The ferromagnetic body 253, the nonmagnetic body 26, and the ferromagnetic body 27 are stacked in this order from the semiconductor substrate 20 side to form a magnetic tunnel junction. Thus, one stacked body 25 may function as the reference layer RL, the spacer layer SP, and the shift cancelling layer SCL of each of the plurality of magnetoresistive effect elements MTJu arranged along the Y direction. The stacked body 25 extends in the Y direction across a plurality of magnetoresistive effect elements MTJu arranged along the Y direction and also functions as a bit line BL. Therefore, the cross-sectional area of the stacked body 25 along the semiconductor substrate 20 may be larger than the cross-sectional area of the ferromagnetic body 27 and the nonmagnetic body 26.

Therefore, it is possible to prevent a decrease in stability of the magnetization directions of the reference layer RL and the shift cancelling layer SCL while reducing the pitch between the magnetoresistive effect elements MTJ. That is, data retention characteristics can be improved and/or maintained while the pitch between magnetoresistive effect elements MTJ is reduced.

In general, retention characteristics (stability) of the reference layer RL and the shift cancelling layer SCL are correlated with, for example, the volumes of the reference layer RL and the shift cancelling layer SCL. That is, if the volumes of the reference layer RL and the shift cancelling layer SCL are increased, higher retention characteristics may be expected. According to the first embodiment, the word lines WLd and the bit lines BL are each formed of a stacked body of materials that can form a SAF structure. Therefore, the cross-sectional area of the reference layer RL and the shift cancelling layer SCL along the semiconductor substrate 20 may be increased without being limited to just the cross-sectional area of the storage layer SL. Therefore, it is possible to prevent a decrease in stability (poorer data retention characteristics) of the magnetization directions of the reference layer RL and the shift cancelling layer SCL when reducing the pitch between the magnetoresistive effect elements MTJ.

1.3 Modification Example

The first embodiment shows a case where the magnetoresistive effect elements MTJd and MTJu both have a top-free configuration in which the storage layer SL is provided above the reference layer RL. The present disclosure is not limited thereto. For example, both of the magnetoresistive effect elements MTJd and MTJu may have a bottom-free configuration in which the storage layer SL is provided below the reference layer RL. In the following description, the description the same as that of the first embodiment will be omitted, and the configuration differences from the first embodiment will be mainly described.

Figure 6:
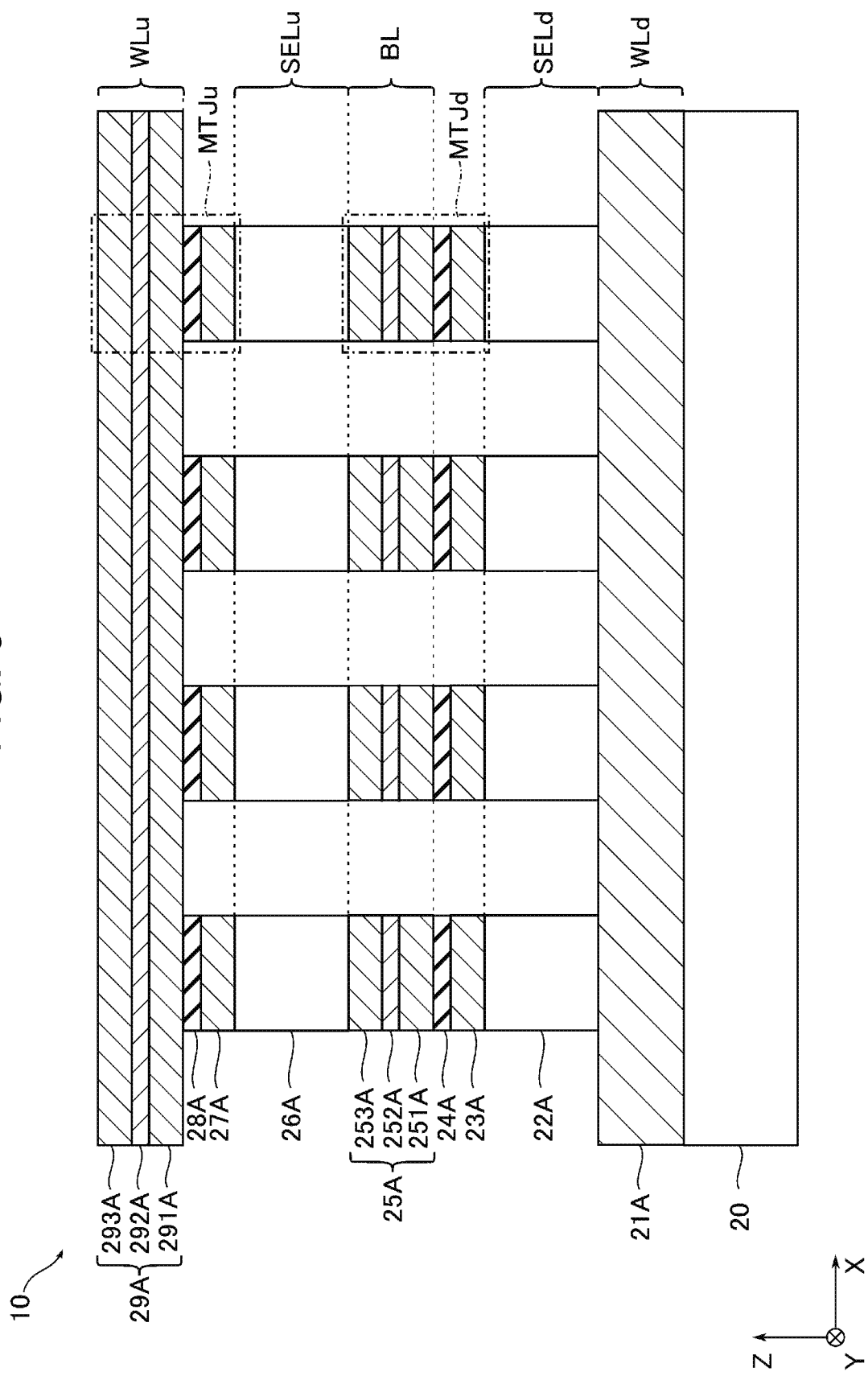
FIG. 6 is a cross-sectional view of a memory cell array of a magnetic storage device according to a modification example of a first embodiment.
Figure 7:
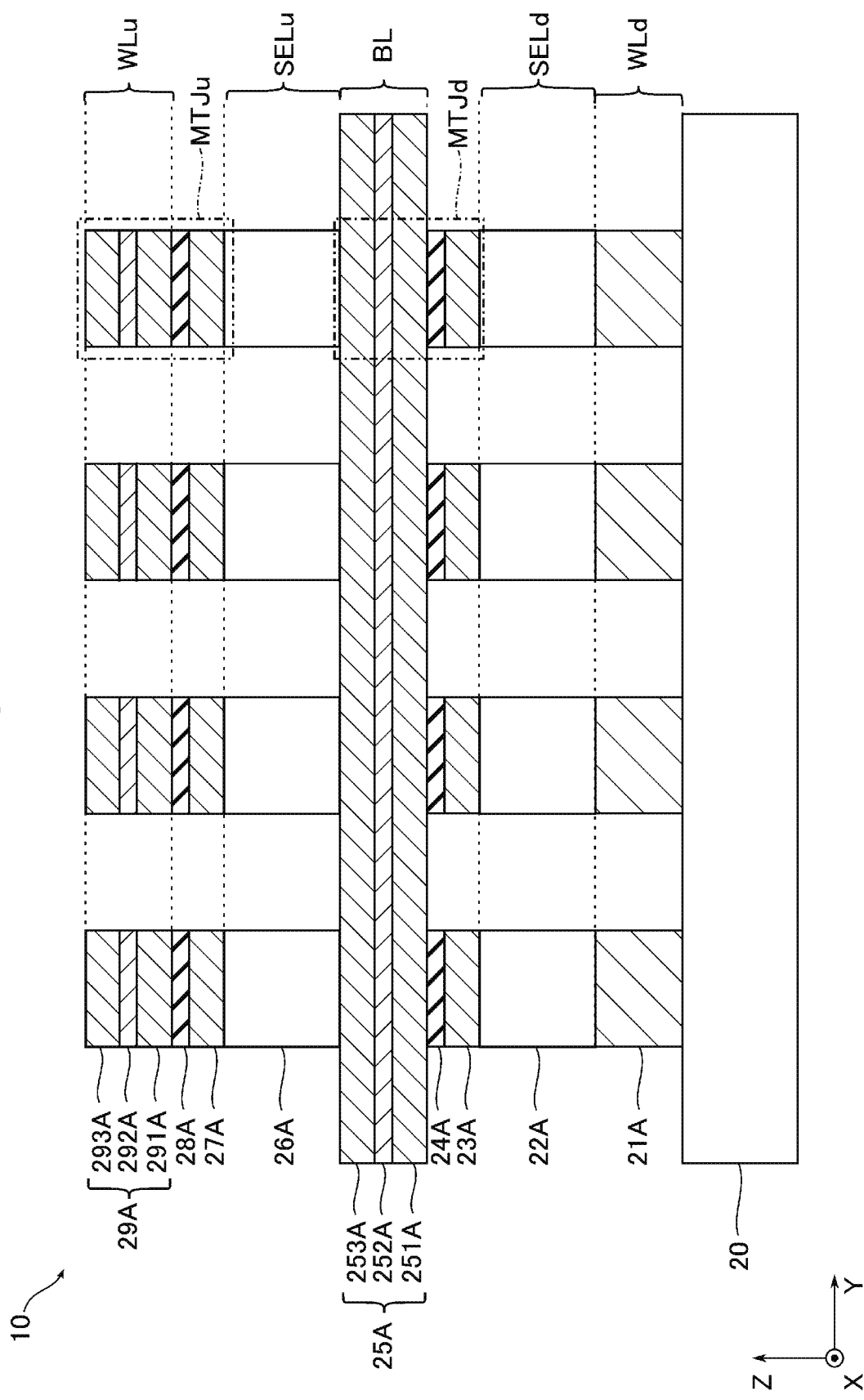
FIG. 7 is another cross-sectional view of a memory cell array of a magnetic storage device according to a modification example of a first embodiment.

FIGS. 6 and 7 show examples of a cross-sectional view showing a configuration of a memory cell array of a magnetic storage device according to a modification example of the first embodiment. FIGS. 6 and 7 are cross-sectional views of the memory cell array 10 as viewed in the Y direction and the X direction, respectively.

On the upper surface of the semiconductor substrate 20, for example, a plurality of conductors 21A each functioning as a word line WLd are provided. For example, the plurality of conductors 21A are provided side by side along the Y direction and each extend along the X direction. While FIGS. 6 and 7 illustrate the case where the plurality of conductors 21A are provided on the semiconductor substrate 20, the present disclosure is not limited thereto. For example, the plurality of conductors 21A may be separately and upwardly provided without being in contact with the semiconductor substrate 20.

On an upper surface of one conductor 21A, a plurality of elements 22A functioning as a selector SELd are provided side by side along the X direction, for example. That is, on one conductor 21A, the plurality of elements 22A arranged along the X direction are commonly connected. A ferromagnetic body 23A is provided on an upper surface of each of the plurality of elements 22A. A nonmagnetic body 24A is provided on an upper surface of each of a plurality of ferromagnetic bodies 23A. The set of the ferromagnetic body 23A and the nonmagnetic body 24A being stacked functions as a portion of one magnetoresistive effect element MTJd. While FIGS. 6 and 7 illustrate the case where each of the plurality of elements 22A is provided on the conductor 21A and the ferromagnetic body 23A, the present disclosure is not limited thereto. For example, each of the plurality of elements 22A may be connected to the conductor 21A and the ferromagnetic body 23A via a conductive contact (not shown).

An upper surface of each of the plurality of nonmagnetic bodies 24A is connected to any one of the plurality of stacked bodies 25A. The plurality of stacked bodies 25A are conductive and function as bit lines BL. For example, the plurality of stacked bodies 25A are provided side by side along the X direction and each extend along the Y direction. That is, the plurality of nonmagnetic bodies 24A arranged along the Y direction is commonly connected to one stacked body 25A.

Each of the plurality of stacked bodies 25A is formed by stacking at least three layers of conductive materials. More specifically, for example, in each of the plurality of stacked bodies 25A, a ferromagnetic body 251A, a nonmagnetic body 252A, and a ferromagnetic body 253A are stacked in this order from the semiconductor substrate 20 side. Each of the plurality of stacked bodies 25A shares a portion of each of a plurality of magnetoresistive effect elements MTJd arranged along the Y direction and also functions as a portion of each of the plurality of magnetoresistive effect elements MTJd.

On an upper surface of one stacked body 25A, a plurality of elements 26A functioning as a selector SELu are provided side by side along the Y direction, for example. That is, on one stacked body 25A, the plurality of elements 26A arranged along the Y direction are commonly connected on the ferromagnetic body 253A. A ferromagnetic body 27A is provided on an upper surface of each of the elements 26A. A nonmagnetic body 28A is provided on an upper surface of each of the ferromagnetic bodies 27A. The set of a ferromagnetic body 27A and a nonmagnetic body 28A stacked on each other functions as a portion of a magnetoresistive effect element MTJu. While FIGS. 6 and 7 illustrate the case where each of the elements 26A is provided directly on the stacked body 25A and the ferromagnetic body 27A, the present disclosure is not limited thereto. For example, each of the elements 26A may be connected to the stacked body 25A and the ferromagnetic body 27A via a conductive contact.

An upper surface of each of the plurality of nonmagnetic bodies 28A is connected to one of a plurality of stacked bodies 29A. The stacked bodies 29A are conductive and function as word lines WLu. For example, the plurality of stacked bodies 29A are provided side by side along the Y direction and each extend along the X direction. That is, the plurality of nonmagnetic bodies 28A arranged along the X direction is commonly connected to one stacked body 29A.

Each of the plurality of stacked bodies 29A is formed by stacking at least three layers of conductive materials. More specifically, for example, in each of the plurality of stacked bodies 29A, a ferromagnetic body 291A, a nonmagnetic body 292A, and a ferromagnetic body 293A are stacked in this order from the semiconductor substrate 20 side. Each of the plurality of stacked bodies 29A shares a portion of each of a plurality of magnetoresistive effect elements MTJu arranged along the X direction and also functions as a portion of each of the plurality of magnetoresistive effect elements MTJu.

By being configured as described above, the memory cell array 10 has a structure in which the memory cells MC are provided at different heights in the Z direction.

Figure 8:
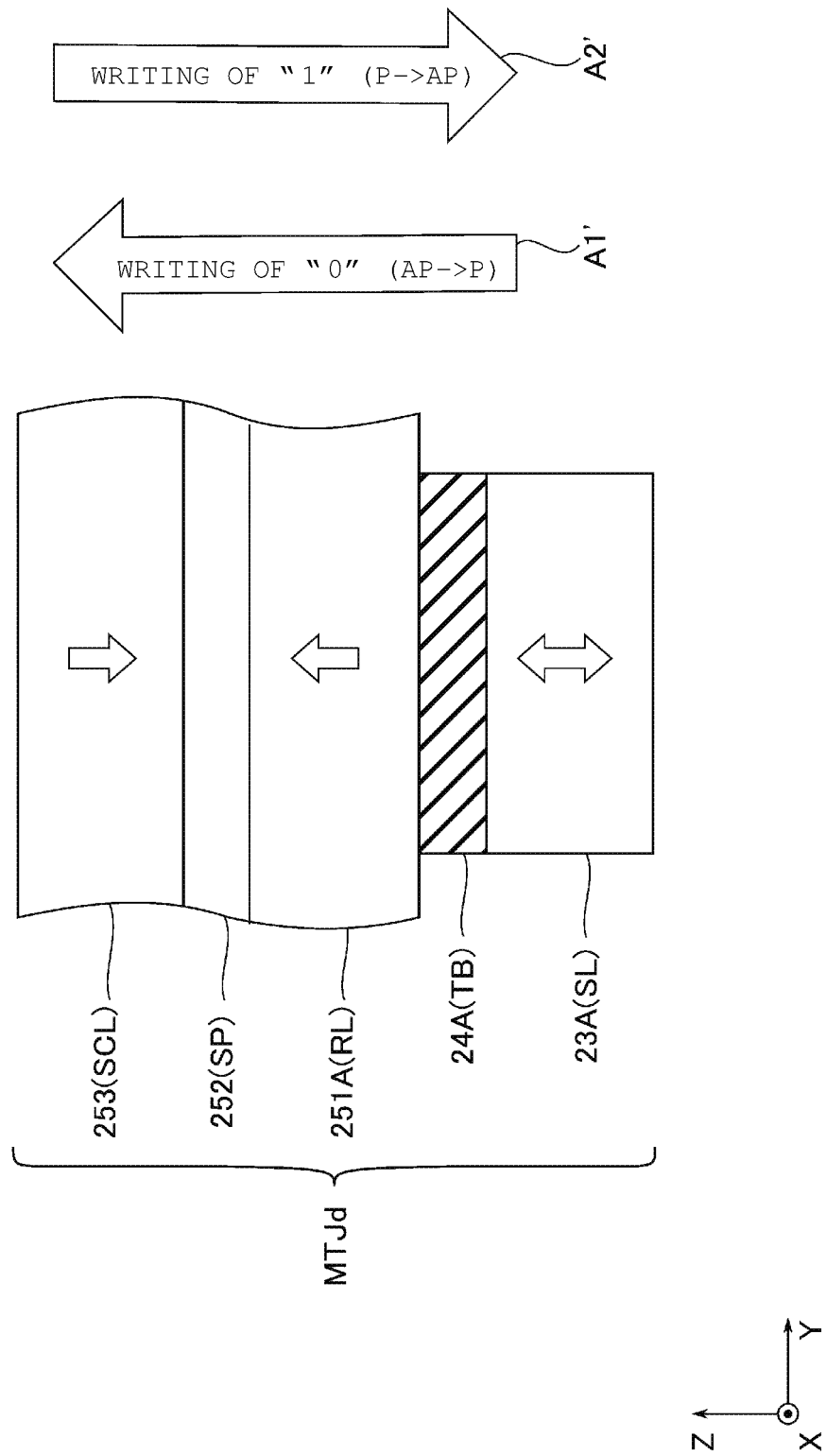
FIG. 8 is a cross-sectional view of a magnetoresistive effect element of a magnetic storage device according to a modification example of a first embodiment.

FIG. 8 is a cross-sectional view showing the configuration of the magnetoresistive effect element of the magnetic storage device according to the modification example of the first embodiment. In FIG. 8, for example, an example of the cross section of the magnetoresistive effect element MTJd (that is, the ferromagnetic body 23A, the nonmagnetic body 24A, and a part of the stacked body 25A (the ferromagnetic body 251A, the nonmagnetic body 252A, and the ferromagnetic body 253A)) shown in FIG. 7 along a plane (for example, YZ plane) perpendicular to the Z direction is shown. Since the magnetoresistive effect element MTJu has the same configuration as that of the magnetoresistive effect element MTJd, the illustration thereof is omitted.

As shown in FIG. 8, the magnetoresistive effect element MTJd includes the ferromagnetic body 23A functioning as a storage layer SL, the nonmagnetic body 24A functioning as a tunnel barrier layer TB, the ferromagnetic body 251A functioning as a reference layer RL, the nonmagnetic body 252A functioning as a spacer layer SP, and the ferromagnetic body 253A functioning as a shift cancelling layer SCL.

In the magnetoresistive effect element MTJd, a plurality of materials are stacked in the order of the ferromagnetic body 23A, the nonmagnetic body 24A, the ferromagnetic body 251A, the nonmagnetic body 252A, and the ferromagnetic body 253A, from the word line WLd side to the bit line BL side (in the Z-axis direction), for example. In the magnetoresistive effect element MTJu, a plurality of materials are stacked in the order of the ferromagnetic body 27A, the nonmagnetic body 28A, the ferromagnetic body 291A, the nonmagnetic body 292A, and the ferromagnetic body 293A, from the bit line BL side to the word line WLu side (in the Z-axis direction), for example.

When a write current Iw0 of a certain magnitude is supplied to the magnetoresistive effect element MTJ in the direction of the arrow A1' in FIG. 8, that is, from the storage layer SL to the reference layer RL, the relative relationship between the magnetization directions of the storage layer SL and the reference layer RL is parallel.

When a write current Iw1 larger than the write current Iw0 is supplied to the magnetoresistive effect element MTJ in the direction of the arrow A2' in FIG. 8, that is, from the reference layer RL to the storage layer SL, the relative relationship between the magnetization directions of the storage layer SL and the reference layer RL is antiparallel.

With the above configuration, even in the configuration including the bottom-free type magnetoresistive effect elements MTJd and MTJu, the same effect as that of the first embodiment may be obtained.

2. Second Embodiment

The first embodiment shows a case where a portion of the magnetoresistive effect element MTJd is provided in the word line WLd and a portion of the magnetoresistive effect element MTJu is provided in the bit line BL. The modification example of the first embodiment shows a case where a portion of the magnetoresistive effect element MTJd is provided in the bit line BL and a portion of the magnetoresistive effect element MTJu is provided in the word line WLu. The possible configuration of the memory cell array 10 is not limited to thereto. For example, both a portion of the magnetoresistive effect element MTJd and a portion of the magnetoresistive effect element MTJu may be provided in one wiring (for example, a bit line BL sandwiched between two word lines WLd and WLu). In the following description, the description of the same configuration as that of the first embodiment will be omitted, and the differences from the first embodiment will be mainly described.

2.1 Configuration of Memory Cell Array

First, a configuration of a memory cell array of a magnetic storage device according to the second embodiment will be described.

Figure 9:
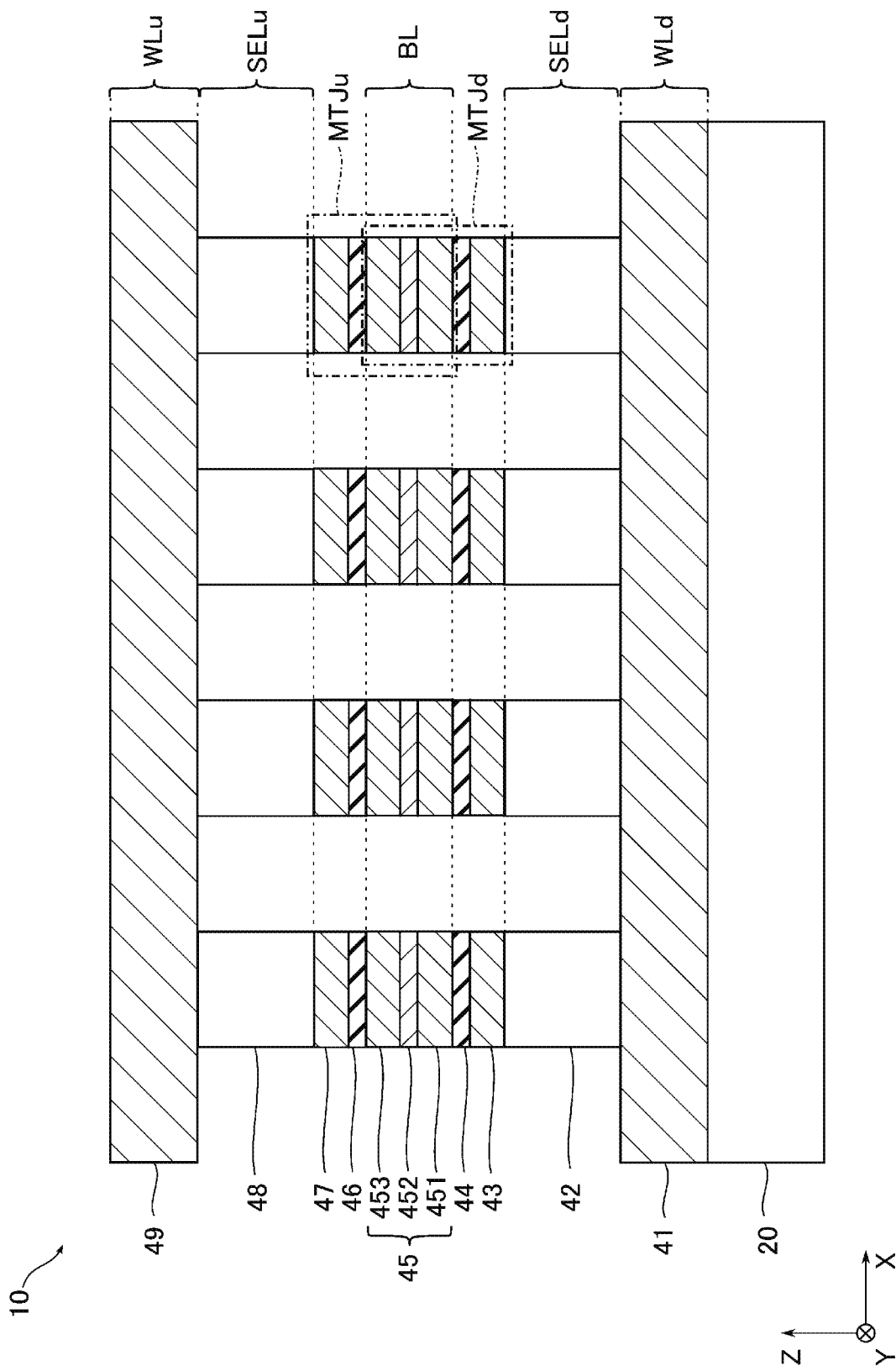
FIG. 9 is a cross-sectional view of a memory cell array of a magnetic storage device according to a second embodiment.
Figure 10:
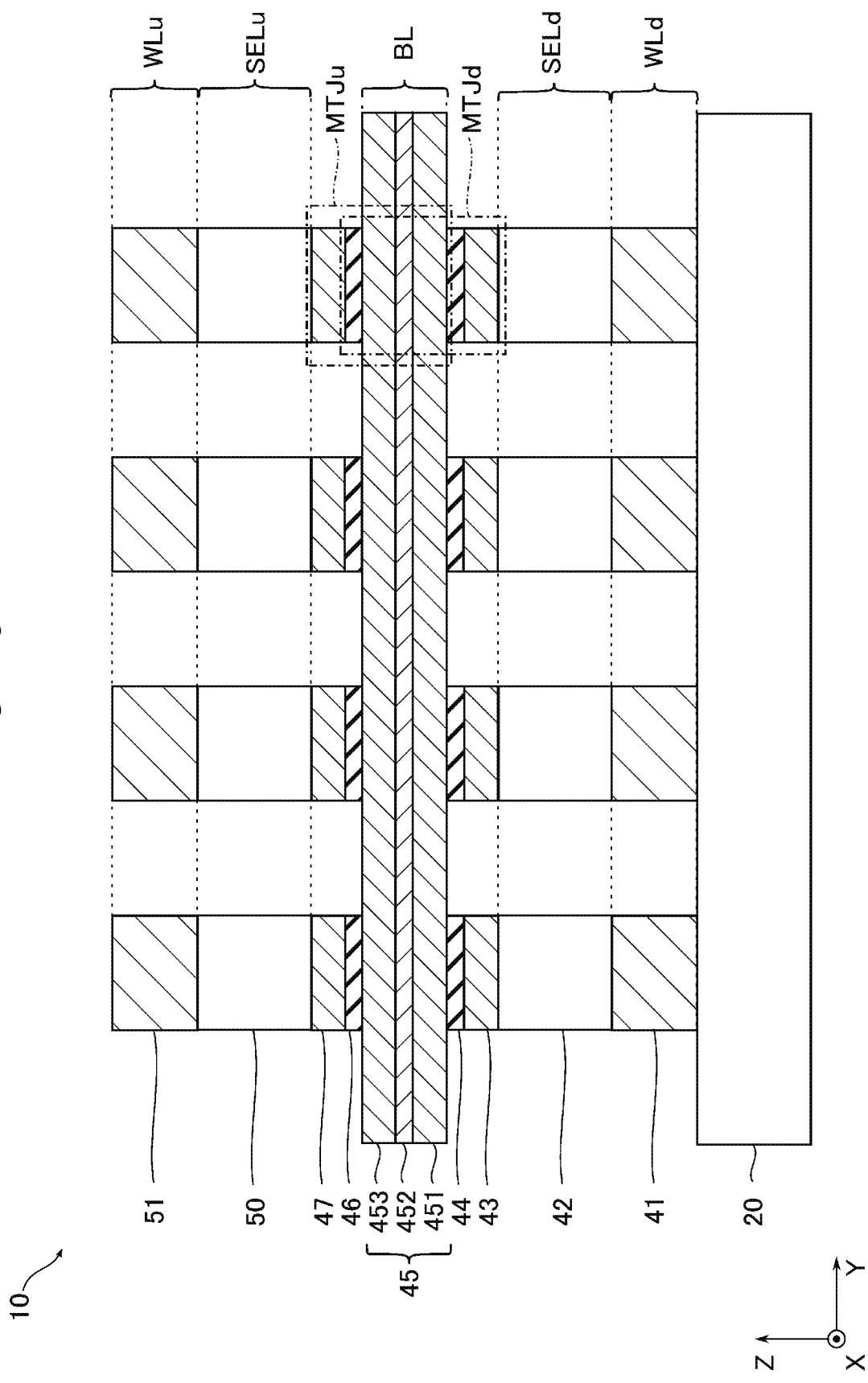
FIG. 10 is another cross-sectional view of a memory cell array of a magnetic storage device according to a second embodiment.

FIGS. 9 and 10 show examples of a cross-sectional view showing the configuration of the memory cell array of the magnetic storage device according to the second embodiment. FIGS. 9 and 10 correspond to FIGS. 3 and 4 in the first embodiment, respectively.

As shown in FIGS. 9 and 10, on the upper surface of the semiconductor substrate 20, for example, a plurality of conductors 41 each functioning as a word line WLd are provided. For example, the plurality of conductors 41 are provided side by side along the Y direction and each extend along the X direction. While FIGS. 9 and 10 illustrate the case where the plurality of conductors 41 are provided on the semiconductor substrate 20, the present disclosure is not limited thereto. For example, the plurality of conductors 41 may be provided without being in direct contact with the semiconductor substrate 20 or extending orthogonally to the substrate 20 plane.

On an upper surface of one conductor 41, a plurality of elements 42 functioning as a selector SELd are provided side by side along the X direction, for example. That is, a plurality of elements 42 arranged along the X direction is commonly connected to one conductor 41. A ferromagnetic body 43 is provided on an upper surface of each of the plurality of elements 42. A nonmagnetic body 44 is provided on an upper surface of each of a plurality of ferromagnetic bodies 43. The ferromagnetic body 43 and the nonmagnetic body 44 as stacked function as a portion of a magnetoresistive effect element MTJd. While FIGS. 9 and 10 illustrate the case where each of the elements 42 is provided directly on the conductor 41 and the ferromagnetic body 43, the present disclosure is not limited thereto. For example, each of the elements 42 may be connected to the conductor 41 and the ferromagnetic body 43 via a conductive contact.

An upper surface of each nonmagnetic body 44 is connected to one of a plurality of stacked bodies 45. The stacked bodies 45 are conductive and function as bit lines BL. For example, stacked bodies 45 are provided side by side along the X direction and each extend along the Y direction. That is, in one stacked body 45, the plurality of nonmagnetic bodies 44 arranged along the Y direction are commonly connected onto the lower surface of a stacked body 45.

Each stacked body 45 is formed by stacking at least three layers of conductive materials. More specifically, for example, in each of the plurality of stacked bodies 45, a ferromagnetic body 451, a nonmagnetic body 452, and a ferromagnetic body 453 are stacked in this order from the semiconductor substrate 20 side. Each stacked body 45 shares a portion of a plurality of magnetoresistive effect elements MTJd arranged along the Y direction and also functions as a portion of each of the magnetoresistive effect elements MTJd. In addition, each of the stacked bodies 45 shares a portion of each magnetoresistive effect element MTJu arranged along the Y direction and also functions as a portion of each of the magnetoresistive effect elements MTJu.

On an upper surface of a stacked body 45, a plurality of nonmagnetic bodies 46 having insulating properties are provided side by side along the Y direction, for example. That is, a plurality of nonmagnetic bodies 46 arranged along the Y direction is commonly connected to the ferromagnetic body 453 in one stacked body 45. A ferromagnetic body 47 is provided on an upper surface of each of the nonmagnetic bodies 46. A nonmagnetic body 46 and a ferromagnetic body 47 being stacked one on the other functions as a portion of a magnetoresistive effect element MTJu.

That is, the ferromagnetic body 43, the nonmagnetic body 44, and at least a portion of the stacked body 45 in contact with the nonmagnetic body 44 function as one magnetoresistive effect element MTJd. The ferromagnetic body 47, the nonmagnetic body 46, and at least a portion of the stacked body 45 in contact with the nonmagnetic body 46 function as one magnetoresistive effect element MTJu.

In the example of FIGS. 9 and 10, the nonmagnetic body 46, the ferromagnetic body 47, and an element 48 are stacked directly above the position of an element 42, a ferromagnetic body 43, and a nonmagnetic body 44 are stacked. In such a case, a portion of the stacked body 45 sandwiched between the nonmagnetic bodies 44 and 46 can function as a portion of the magnetoresistive effect element MTJd or as a portion of the magnetoresistive effect element MTJu.

The element 48 functioning as a selector SELd is provided on an upper surface of each of a plurality of ferromagnetic bodies 47. An upper surface of each of a plurality of elements 48 is connected to one of a plurality of conductors 49. The conductors 49 are conductive and function as word lines WLu. For example, the plurality of conductors 49 are provided side by side along the Y direction and each extend along the X direction. That is, the plurality of elements 48 arranged along the X direction is commonly connected to one conductor 49.

With the above configuration, the memory cell array 10 has a structure in which a bit line BL includes both a portion of each of the magnetoresistive effect elements MTJd and a portion of each of the magnetoresistive effect elements MTJu.

2.2 Configuration of Magnetoresistive Effect Element

Figure 11:
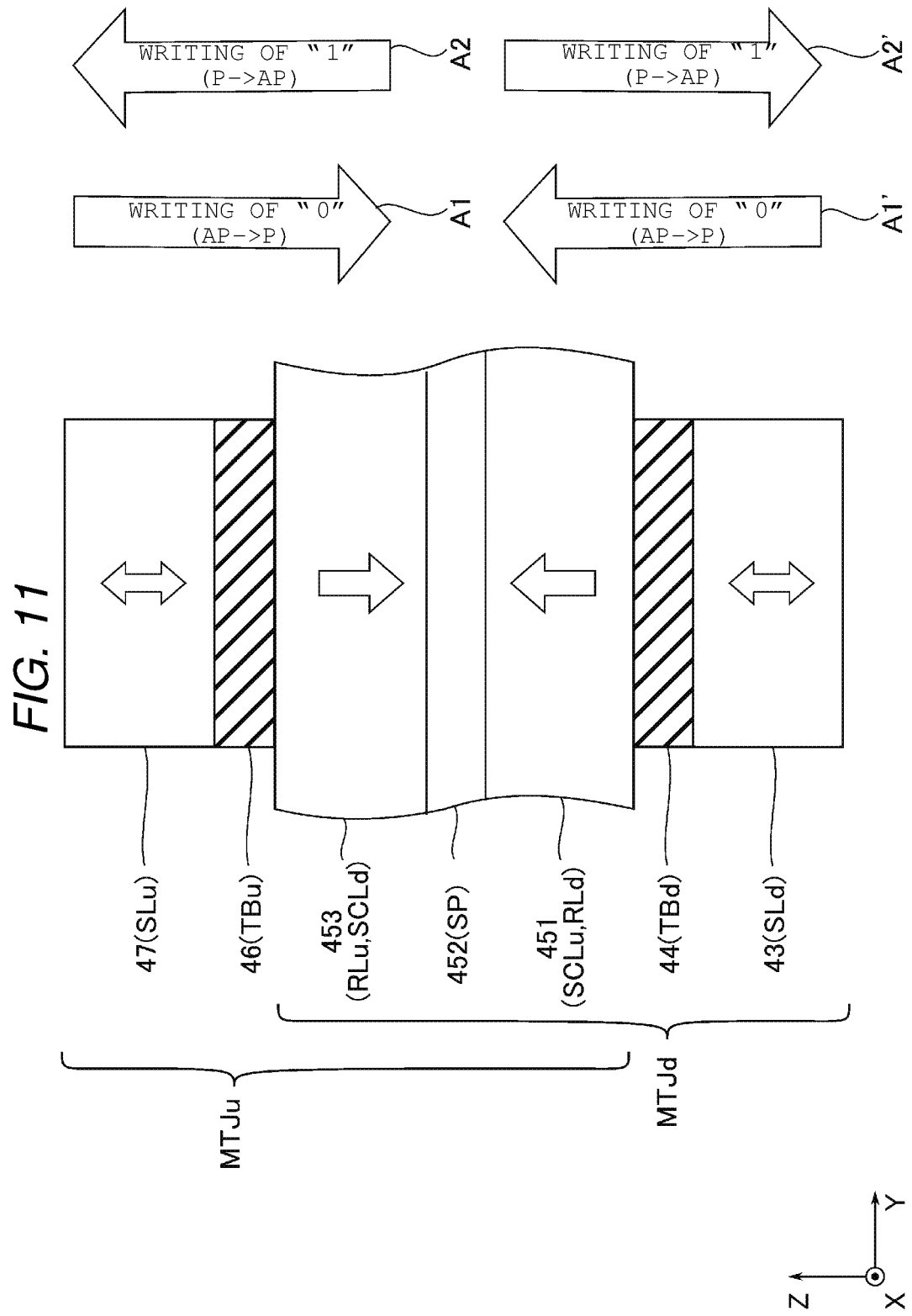
FIG. 11 is a cross-sectional view of a magnetoresistive effect element of a magnetic storage device according to a second embodiment.

Next, a configuration of the magnetoresistive effect element of the magnetic storage device according to the second embodiment will be described with reference to FIG. 11. FIG. 11 is a cross-sectional view showing the configuration of the magnetoresistive effect element of the magnetic storage device according to the second embodiment. FIG. 11 shows, for example, an example of a cross section of the magnetoresistive effect element MTJd (that is, the ferromagnetic body 43, the nonmagnetic body 44, the ferromagnetic body 451, the nonmagnetic body 452, and the ferromagnetic body 453) and the magnetoresistive effect element MTJu (that is, the ferromagnetic body 47, the nonmagnetic body 46, the ferromagnetic body 453, the nonmagnetic body 452, and the ferromagnetic body 451) shown in FIG. 10 along a YZ plane perpendicular to the Z direction.

As shown in FIG. 11, the magnetoresistive effect element MTJd includes the ferromagnetic body 43 functioning as a storage layer SLd, the nonmagnetic body 44 functioning as a tunnel barrier layer TBd, the ferromagnetic body 451 functioning as a reference layer RLd, the nonmagnetic body 452 functioning as a spacer layer SPd, and the ferromagnetic body 453 functioning as a shift cancelling layer SCLd. The magnetoresistive effect element MTJu includes the ferromagnetic body 47 functioning as a storage layer SLu, the nonmagnetic body 46 functioning as a tunnel barrier layer TBu, the ferromagnetic body 453 functioning as a reference layer RLu, the nonmagnetic body 452 functioning as a spacer layer SPu, and the ferromagnetic body 451 functioning as a shift cancelling layer SCLu. That is, the ferromagnetic body 451 functions as the reference layer RLd and the shift cancelling layer SCLu, and the ferromagnetic body 453 functions as the reference layer RLu and the shift cancelling layer SCLd.

The ferromagnetic body 43 and the nonmagnetic body 44 have the same configuration as those of the ferromagnetic body 23A and the nonmagnetic body 24A illustrated in FIG. 8 in the modification example of the first embodiment, and thus further description thereof will be omitted.

The ferromagnetic body 47 and the nonmagnetic body 46 have the same configuration as those of the ferromagnetic body 23 and the nonmagnetic body 22 illustrated in FIG. 5 in the first embodiment, and thus further description thereof will be omitted.

As described above, the ferromagnetic bodies 451 and 453 are configured to function as both the reference layer RL and the shift cancelling layer SCL. That is, the ferromagnetic bodies 451 and 453 are antiferromagnetically coupled to each other by the nonmagnetic body 452 and have a vertically symmetrical configuration with respect to the nonmagnetic body 452. Therefore, the film thicknesses of the ferromagnetic bodies 451 and 453 may be substantially equal.

More specifically, the ferromagnetic body 451 contains, for example, cobalt iron boron (CoFeB) or iron boride (FeB) at the interface with the nonmagnetic body 44. Although not shown in FIG. 11, the ferromagnetic body 451 may be a stacked body including a plurality of layers. Specifically, for example, the stacked body constituting the ferromagnetic body 451 may have a structure in which additional ferromagnetic body is stacked on an upper surface of the layer formed at the interface with the nonmagnetic body 44 via the nonmagnetic conductor. The nonmagnetic conductor in the stacked body constituting the ferromagnetic body 451 may include, for example, at least one metal selected from tantalum (Ta), hafnium (Hf), tungsten (W), zirconium (Zr), molybdenum (Mo), niobium (Nb), and titanium (Ti). The additional ferromagnetic body in the stacked body constituting the ferromagnetic body 451 may include, for example, at least one artificial lattice selected from a multilayer film (Co/Pt multilayer film) of cobalt (Co) and platinum (Pt), a multilayer film (Co/Ni multilayer film) of cobalt (Co) and nickel (Ni), and a multilayer film (Co/Pd multilayer film) of cobalt (Co) and palladium (Pd). Then, the additional ferromagnetic body in the stacked body constituting the ferromagnetic body 451 contacts the nonmagnetic body 452.

Similarly, the ferromagnetic body 453 contains, for example, cobalt iron boron (CoFeB) or iron boride (FeB) at the interface with the nonmagnetic body 46. Although not specifically depicted in FIG. 11, the ferromagnetic body 453 may be a stacked body including a plurality of layers. Specifically, the ferromagnetic body 453 may have a structure in which an additional ferromagnetic body is stacked on a lower surface at the interface with the nonmagnetic body 46 via a nonmagnetic conductor. The nonmagnetic conductor in the stacked body constituting the ferromagnetic body 453 may include, for example, at least one metal selected from tantalum (Ta), hafnium (Hf), tungsten (W), zirconium (Zr), molybdenum (Mo), niobium (Nb), and titanium (Ti). The additional ferromagnetic body in the ferromagnetic body 453 may include, for example, at least one artificial lattice selected from a multilayer film (Co/Pt multilayer film) of cobalt (Co) and platinum (Pt), a multilayer film (Co/Ni multilayer film) of cobalt (Co) and nickel (Ni), and a multilayer film (Co/Pd multilayer film) of cobalt (Co) and palladium (Pd). The additional ferromagnetic body in the ferromagnetic body 453 contacts the nonmagnetic body 452.

The nonmagnetic body 452 is a nonmagnetic conductive film and includes, for example, at least one element selected from ruthenium (Ru), osmium (Os), iridium (Ir), vanadium (V), and chromium (Cr).

With the above configuration, the ferromagnetic body 451 may form a magnetic tunnel junction with the ferromagnetic body 43 and the nonmagnetic body 44, and the ferromagnetic body 453 may form a magnetic tunnel junction with the ferromagnetic body 47 and the nonmagnetic body 46. In addition, the ferromagnetic bodies 451 and 453 may form a SAF structure to reduce or offset the stray fields generated by each other.

2.3 Effects of Present Embodiment

According to the second embodiment, the stacked body 45 includes the ferromagnetic body 451, the nonmagnetic body 452, and the ferromagnetic body 453 sequentially stacked from the semiconductor substrate 20 side to form a SAF structure. The ferromagnetic body 43, the nonmagnetic body 44, and the ferromagnetic body 451 form a magnetic tunnel junction. The ferromagnetic body 47, the nonmagnetic body 46, and the ferromagnetic body 453 form a magnetic tunnel junction. Thus, one stacked body 45 may function as the reference layer RL, the spacer layer SP, and the shift cancelling layer SCL of each of the plurality of magnetoresistive effect elements MTJd and each of the plurality of magnetoresistive effect elements MTJu arranged along the Y direction. The stacked body 45 extends in the Y direction across the plurality of magnetoresistive effect elements MTJd and MTJu arranged along the Y direction and also functions as a bit line BL. Therefore, the cross-sectional area of the stacked body 45 along the semiconductor substrate 20 may be larger than the cross-sectional area of the ferromagnetic body 43 and the nonmagnetic body 44, or the ferromagnetic body 47 and the nonmagnetic body 46. Therefore, it is possible to prevent a decrease in stability (data retention characteristics) of the magnetization directions of the reference layer RL and the shift cancelling layer SCL while reducing the pitch between the magnetoresistive effect elements MTJ.

As described above, the stacked body 45 functions as the reference layer RL, the spacer layer SP, and the shift cancelling layer SCL of the magnetoresistive effect elements MTJd and MTJu stacked in the Z direction. As a result, the number of stacked layers may be reduced as compared to the case where two separate sets of reference layers RL, spacer layers SP, and shift cancelling layers SCL must be prepared for the two magnetoresistive effect elements MTJ. Therefore, number of manufacturing steps of the memory cell array 10 may be reduced.

The ferromagnetic bodies 451 and 453 have a vertically symmetrical configuration with respect to the nonmagnetic body 452. Thereby, the mutual stray fields may be reduced or offset at the same rate. Therefore, the ferromagnetic bodies 451 and 453 may function as the shift cancelling layer SCL of one of the magnetoresistive effect elements MTJd and MTJu while functioning as the reference layer RL of the other.

3. Third Embodiment

The second embodiment show a case where the bit line BL is formed of the material forming the SAF structure, which is non-limiting. For example, the bit line BL may include a conductor having a lower resistance than the conductor forming the SAF structure to reduce the resistance value. In the following description, the description of the same configuration as those of the first embodiment and the second embodiment is omitted, and the configuration differences from the first embodiment and the second embodiment will be mainly described.

3.1 Configuration of Memory Cell Array

First, a configuration of a memory cell array of a magnetic storage device according to the third embodiment will be described.

Figure 12:
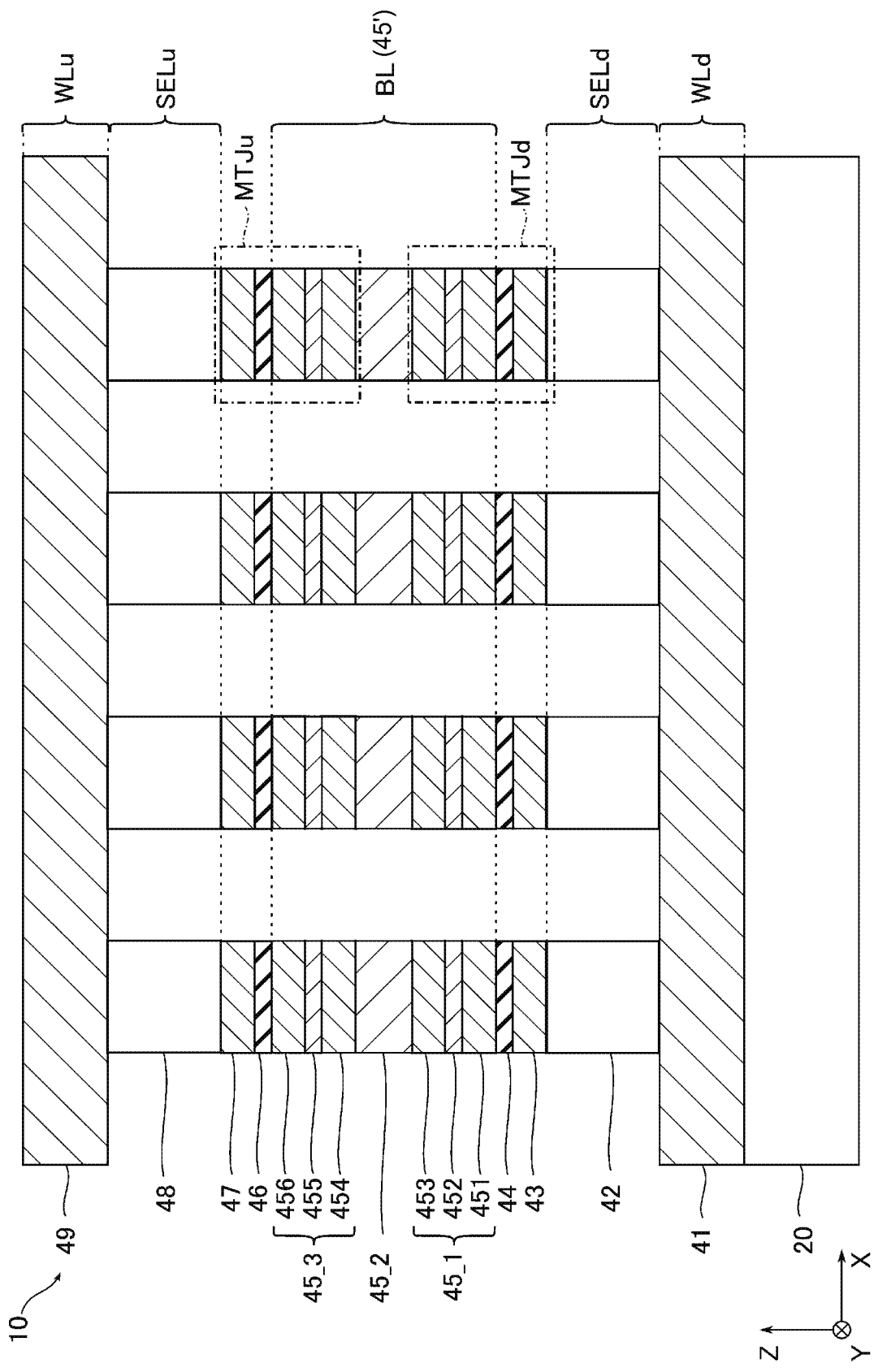
FIG. 12 is a cross-sectional view of a memory cell array of a magnetic storage device according to a third embodiment.
Figure 13:
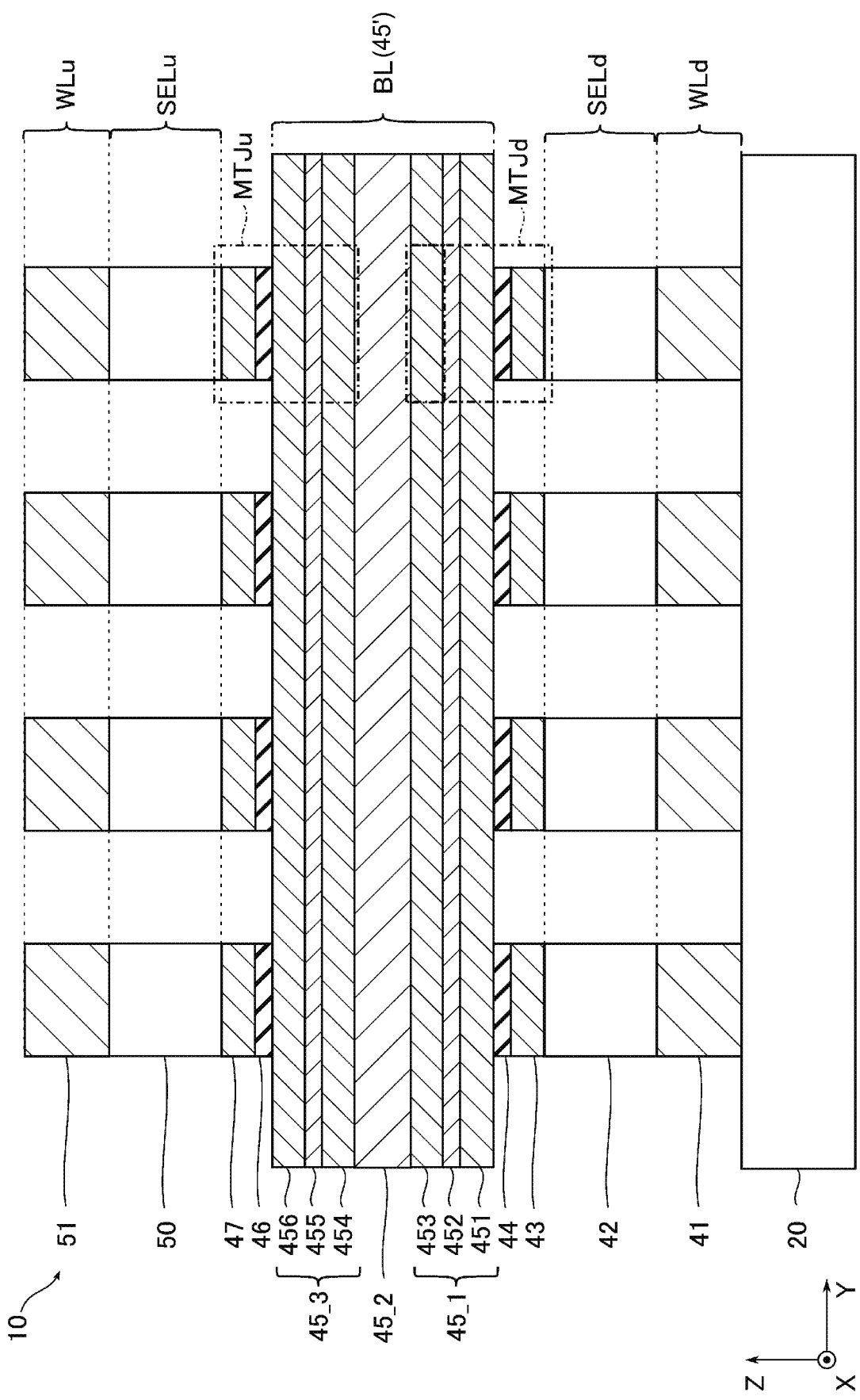
FIG. 13 is another cross-sectional view of a memory cell array of a magnetic storage device according to a third embodiment.

FIGS. 12 and 13 show examples of a cross-sectional view showing a configuration of the memory cell array of the magnetic storage device according to the third embodiment. FIGS. 12 and 13 respectively correspond to FIGS. 3 and 4 in the first embodiment, FIGS. 6 and 7 in the modification example of the first embodiment, and FIGS. 9 and 10 in the second embodiment.

As shown in FIGS. 12 and 13, since the configurations of the conductor 41, the element 42, the ferromagnetic body 43, and the nonmagnetic body 44 are the same as those of the conductor 21A, the element 22A, the ferromagnetic body 23A, and the nonmagnetic body 24A illustrated in FIGS. 6 and 7 in the modification example of the first embodiment, further description thereof is omitted.

Each of a plurality of stacked bodies 45' is connected onto the upper surface of each of the plurality of nonmagnetic bodies 44. The stacked bodies 45' are conductive and function as bit lines BL. For example, the plurality of stacked bodies 45' are provided side by side along the X direction and each extend along the Y direction. That is, in a stacked body 45', the plurality of nonmagnetic bodies 44 arranged along the Y direction are commonly connected onto the lower surface of the stacked body 45'.

Each of the stacked bodies 45' is comprises a stack of at least seven layers of conductive materials. More specifically, for example, in each of the stacked bodies 45', a SAF layer 45_1, a low resistance layer 45_2, and a SAF layer 45_3 are stacked in this order from the semiconductor substrate 20 side.

In the SAF layer 45_1, the ferromagnetic body 451, the nonmagnetic body 452, and the ferromagnetic body 453 are stacked in this order from the semiconductor substrate 20 side. Since the configuration of the SAF layer 45_1 (the ferromagnetic body 451, the nonmagnetic body 452, and the ferromagnetic body 453) is the same as that of the stacked body 25A (the ferromagnetic body 251A, the nonmagnetic body 252A, and the ferromagnetic body 253A) illustrated in FIGS. 6 and 7 in the modification example of the first embodiment, further description thereof is omitted.

The low resistance layer 45_2 is a conductor having a lower resistance than the SAF layers 45_1 and 45_3. The low resistance layer 45_2 comprises, for example, copper (Cu) or aluminum (Al), and has a function of preventing an increase in the wiring resistance of the bit line BL.

In the SAF layer 45_3, a ferromagnetic body 454, a nonmagnetic body 455, and a ferromagnetic body 456 are stacked in this order from the semiconductor substrate 20 side. Since the configuration of the SAF layer 45_3 (the ferromagnetic body 454, the nonmagnetic body 455, and ferromagnetic body 456) is the same as that of the stacked body 25 (the ferromagnetic body 251, the nonmagnetic body 252, and the ferromagnetic body 253) illustrated in FIGS. 3 and 4 in the first embodiment, further description thereof is omitted.

The SAF layer 45_1 of each of the stacked bodies 45' shares a portion of each of the plurality of magnetoresistive effect elements MTJd arranged along the Y direction and also functions as a portion of each of the magnetoresistive effect elements MTJd. In addition, the SAF layer 45_3 of each of the stacked bodies 45' shares a portion of each of a plurality of magnetoresistive effect elements MTJu arranged along the Y direction and also functions as a portion of each of the plurality of magnetoresistive effect elements MTJu.

Since the configurations of the nonmagnetic body 46, the ferromagnetic body 47, the element 48, and the conductor 49 are the same as those of the nonmagnetic body 26, the ferromagnetic body 27, the element 28, and the conductor 29 illustrated in FIGS. 3 and 4 in the first embodiment, further description thereof is omitted.

With the above configuration, the memory cell array 10 has a structure in which one bit line BL includes both of a portion of each of the plurality of magnetoresistive effect elements MTJd and a portion of each of the plurality of magnetoresistive effect elements MTJu.

3.2 Configuration of Magnetoresistive Effect Element

Figure 14:
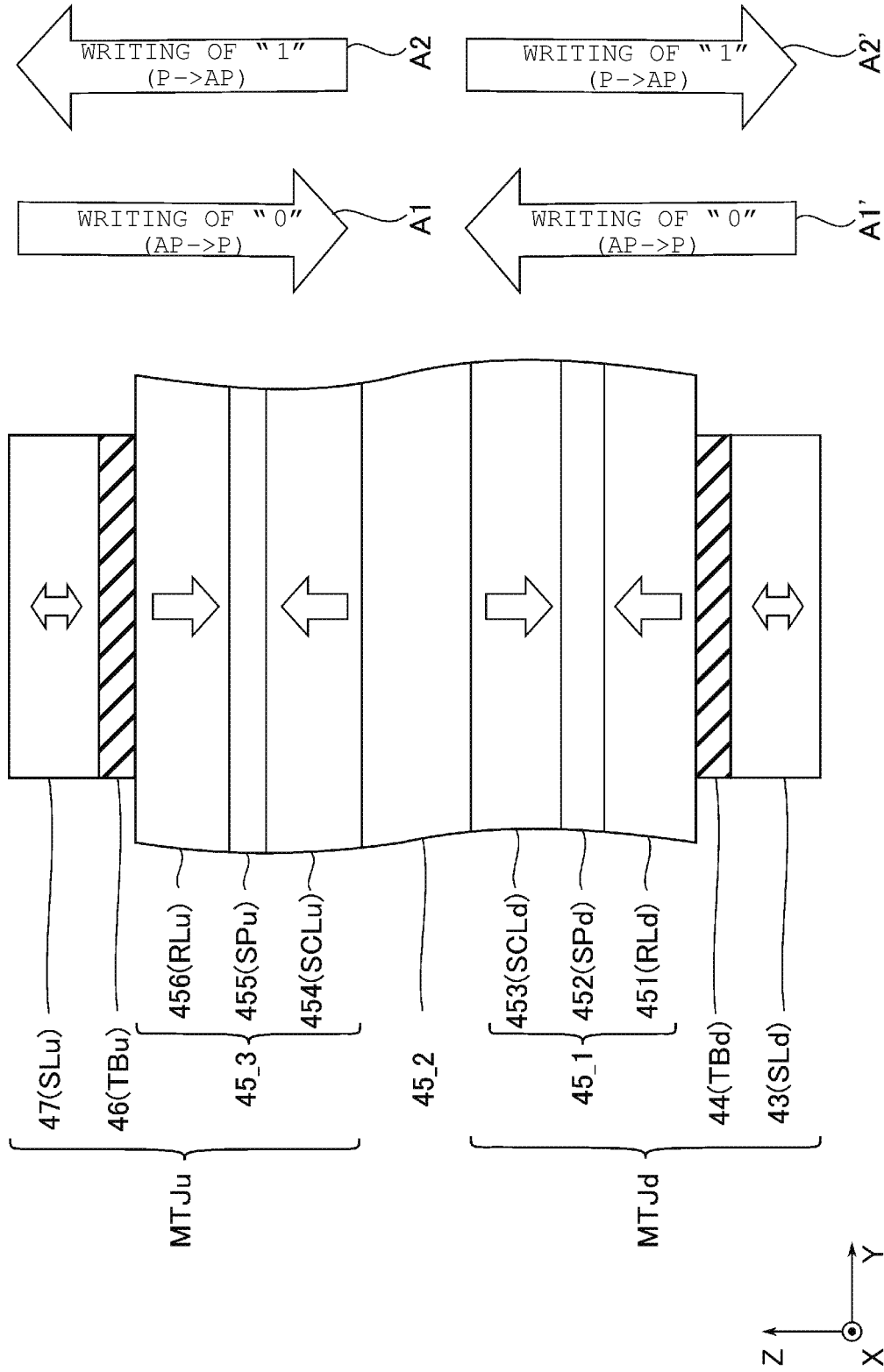
FIG. 14 is a cross-sectional view of a magnetoresistive effect element of a magnetic storage device according to a third embodiment.

Next, the configuration of the magnetoresistive effect element of the magnetic storage device according to the third embodiment will be described with reference to FIG. 14. FIG. 14 is a cross-sectional view showing the configuration of the magnetoresistive effect element of the magnetic storage device according to the third embodiment. FIG. 14 shows, for example, an example of a cross section of the magnetoresistive effect element MTJd (that is, the ferromagnetic body 43, the nonmagnetic body 44, the ferromagnetic body 451, the nonmagnetic body 452, and the ferromagnetic body 453) and the magnetoresistive effect element MTJu (that is, the ferromagnetic body 47, the nonmagnetic body 46, the ferromagnetic body 456, the nonmagnetic body 455, and ferromagnetic body 454) shown in FIG. 13 along a plane (for example, YZ plane) perpendicular to the Z direction.

As shown in FIG. 14, the magnetoresistive effect element MTJd includes the ferromagnetic body 43 functioning as a storage layer SLd, the nonmagnetic body 44 functioning as a tunnel barrier layer TBd, the ferromagnetic body 451 functioning as a reference layer RLd, the nonmagnetic body 452 functioning as a spacer layer SPd, and the ferromagnetic body 453 functioning as a shift cancelling layer SCLd. The magnetoresistive effect element MTJu includes the ferromagnetic body 47 functioning as a storage layer SLu, the nonmagnetic body 46 functioning as a tunnel barrier layer TBu, the ferromagnetic body 456 functioning as a reference layer RLu, the nonmagnetic body 455 functioning as a spacer layer SPu, and the ferromagnetic body 454 functioning as a shift cancelling layer SCLu.

Thus, the magnetoresistive effect elements MTJd and MTJu according to the third embodiment have a structure in the configuration of the magnetoresistive effect element MTJd illustrated in FIG. 8 in the modification example of the first embodiment, and the configuration of the magnetoresistive effect element MTJu illustrated in FIG. 5 in the first embodiment are provided to sandwich the low resistance layer 45_2.

With the above configuration, the magnetoresistive effect elements MTJd and MTJu are separated from each other while a portion of the magnetoresistive effect element MTJd and a portion of the magnetoresistive effect element MTJu are provided in one bit line BL.

3.3 Effects of Present Embodiment

According to the third embodiment, the stacked body 45' includes the SAF layer 45_1, the low resistance layer 45_2, and the SAF layer 45_3. The ferromagnetic body 451, the nonmagnetic body 452, and the ferromagnetic body 453 in the SAF layer 45_1 form a SAF structure, and the ferromagnetic body 451, the nonmagnetic body 44, and the ferromagnetic body 43 form a magnetic tunnel junction. The ferromagnetic body 456, the nonmagnetic body 455, and the ferromagnetic body 454 in the SAF layer 45_3 form a SAF structure, and the ferromagnetic body 456, the nonmagnetic body 46, and the ferromagnetic body 47 forma magnetic tunnel junction. Thus, one stacked body 45' may function as the reference layer RL, the spacer layer SP, and the shift cancelling layer SCL of each of the plurality of magnetoresistive effect elements MTJd and each of the plurality of magnetoresistive effect elements MTJu arranged along the Y direction. The stacked body 45' extends in the Y direction across the plurality of magnetoresistive effect elements MTJd and MTJu arranged along the Y direction and also functions as a bit line BL. Therefore, the cross-sectional area of the stacked body 45' along the semiconductor substrate 20 may be larger than the cross-sectional area of the ferromagnetic body 43 and the nonmagnetic body 44, or the ferromagnetic body 47 and the nonmagnetic body 46. Therefore, it is possible to prevent a decrease in stability (retention characteristics) of the magnetization directions of the reference layer RL and the shift cancelling layer SCL while reducing the pitch between the magnetoresistive effect elements MTJ.

The low resistance layer 45_2 is provided between the SAF layers 45_1 and 45_3, and the resistance value of the low resistance layer 45_2 is smaller than those of the SAF layers 45_1 and 45_3. Thereby, the increase in the resistance value of the stacked body 45' may be prevented, and further, the increase in the power consumption may be prevented.

4. Other

The present embodiment of the present disclosure is not limited to the above-described first embodiment, second embodiment, and third embodiment, and various modifications can be applied.

For example, while the first embodiment, the second embodiment, and the third embodiment show cases where the magnetoresistive effect element MTJ is a perpendicular magnetization MTJ, the present embodiment of the present disclosure is not limited thereto. The magnetoresistive effect element MTJ may be an in-plane magnetization MTJ element having magnetic anisotropy parallel to the film surface.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:
1. A magnetic storage device, comprising:
   a first stacked body extending in a first direction and including a first ferromagnetic body;
   a second stacked body extending in a second direction and including a second ferromagnetic body;
   a first magnetoresistive effect element that comprises the first ferromagnetic body, a third ferromagnetic body, and a first nonmagnetic body between the first ferromagnetic body and the third ferromagnetic body;
   a second magnetoresistive effect element spaced from the first magnetoresistive effect element in the first direction and comprises the first ferromagnetic body, a fourth ferromagnetic body, and a second nonmagnetic body between the first ferromagnetic body and the fourth ferromagnetic body;
   a third magnetoresistive effect element that comprises the second ferromagnetic body, a fifth ferromagnetic body, and a third nonmagnetic body between the second ferromagnetic body and the fifth ferromagnetic body; and
   a fourth magnetoresistive effect element spaced from the third magnetoresistive effect element in the second direction and comprises the second ferromagnetic body, a sixth ferromagnetic body, and a fourth nonmagnetic body between the second ferromagnetic body and the sixth ferromagnetic body, wherein
   the third ferromagnetic body and the fourth ferromagnetic body are between the first stacked body and the second stacked body in a stacking direction of the first stacked body and the second stacked body, and
   the second stacked body is between the third ferromagnetic body and the fourth ferromagnetic body, and between the fifth ferromagnetic body and the sixth ferromagnetic body in the stacking direction of the first stacked body and the second stacked body.

2. The magnetic storage device according to claim 1, wherein
the first stacked body further includes a seventh ferromagnetic body and a fifth nonmagnetic body that is between the first ferromagnetic body and the seventh ferromagnetic body, and
the second stacked body further includes an eighth ferromagnetic body and a sixth nonmagnetic body that is between the second ferromagnetic body and the eighth ferromagnetic body.

3. The magnetic storage device according to claim 2, wherein
the first magnetoresistive effect element includes a first portion of the first stacked body,
the second magnetoresistive effect element includes a second portion of the first stacked body,
the third magnetoresistive effect element includes a first portion of the second stacked body, and
the fourth magnetoresistive effect element includes a second portion of the second stacked body.

4. The magnetic storage device according to claim 2, wherein
the seventh ferromagnetic body is opposite the third ferromagnetic body and the fourth ferromagnetic body with the first ferromagnetic body therebetween,
the eighth ferromagnetic body is opposite the fifth ferromagnetic body and the sixth ferromagnetic body with the second ferromagnetic body therebetween,
the first ferromagnetic body has a thickness in the stacking direction less than the seventh ferromagnetic body, and
the second ferromagnetic body has a thickness in the stacking direction less than the eighth ferromagnetic body.

5. The magnetic storage device according to claim 1, wherein the first stacked body and the second stacked body are connected via the third ferromagnetic body without the fourth ferromagnetic body, the fifth ferromagnetic body, and the sixth ferromagnetic body being in the connection therebetween.

6. The magnetic storage device according to claim 1, wherein the first direction and the second direction are different directions from each other.

7. A magnetic storage device, comprising:
a stacked body that includes a first ferromagnetic body and a second ferromagnetic body;
a first magnetoresistive effect element that comprises the first ferromagnetic body, a third ferromagnetic body, and a first nonmagnetic body between the first ferromagnetic body and the third ferromagnetic body;
a second magnetoresistive effect element that comprises the first ferromagnetic body, a fourth ferromagnetic body, and a second nonmagnetic body between the first ferromagnetic body and the fourth ferromagnetic body;
a third magnetoresistive effect element that comprises the second ferromagnetic body, a fifth ferromagnetic body, and a third nonmagnetic body between the second ferromagnetic body and the fifth ferromagnetic body; and
a fourth magnetoresistive effect element that comprises the second ferromagnetic body, a sixth ferromagnetic body, and a fourth nonmagnetic body between the second ferromagnetic body and the sixth ferromagnetic body, wherein
the stacked body is between the third ferromagnetic body and the fourth ferromagnetic body in a stacking direction of the stacked body, and
the stacked body is between the fifth ferromagnetic body and the sixth ferromagnetic body in the stacking direction.

8. The magnetic storage device according to claim 7, wherein the stacked body further includes a fifth nonmagnetic body between the first ferromagnetic body and the second ferromagnetic body.

9. The magnetic storage device according to claim 8, wherein
the first magnetoresistive effect element and the third magnetoresistive effect element each include a first portion of the stacked body, and
the second magnetoresistive effect element and the fourth magnetoresistive effect element each include a second portion of the stacked body.

10. The magnetic storage device according to claim 8, wherein the first ferromagnetic body has a thickness in the stacking direction equal to the second ferromagnetic body.

11. The magnetic storage device according to claim 8, wherein the first ferromagnetic body and the second ferromagnetic body are symmetrical about the fifth nonmagnetic body.

12. The magnetic storage device according to claim 8, wherein the fifth nonmagnetic body comprises at least one of ruthenium and iridium.

13. The magnetic storage device according to claim 7, wherein the stacked body further includes:
a seventh ferromagnetic body;
a fifth nonmagnetic body between the first ferromagnetic body and the seventh ferromagnetic body;
an eighth ferromagnetic body;
a sixth nonmagnetic body between the second ferromagnetic body and the eighth ferromagnetic body; and
a conductor between the first ferromagnetic body and the seventh ferromagnetic body in the stacking direction.

14. The magnetic storage device according to claim 13, wherein
the first magnetoresistive effect element comprises first portions of the first ferromagnetic body, the seventh ferromagnetic body, and the fifth nonmagnetic body,
the second magnetoresistive effect element comprises second portions of the first ferromagnetic body, the seventh ferromagnetic body, and the fifth nonmagnetic body,
the third magnetoresistive effect element comprises first portions of the second ferromagnetic body, the eighth ferromagnetic body, and the sixth nonmagnetic body, and
the fourth magnetoresistive effect element comprises second portions of the second ferromagnetic body, the eighth ferromagnetic body, and the sixth nonmagnetic body.

15. The magnetic storage device according to claim 13, wherein
the seventh ferromagnetic body is opposite the third ferromagnetic body and the fourth ferromagnetic body the first ferromagnetic body therebetween,
the eighth ferromagnetic body is opposite the fifth ferromagnetic body and the sixth ferromagnetic body with the second ferromagnetic body therebetween,
the first ferromagnetic body has a thickness in the stacking direction less than the seventh ferromagnetic body, and
the second ferromagnetic body has a thickness in the stacking direction less than the eighth ferromagnetic body.

16. The magnetic storage device according to claim 13, wherein the conductor comprises copper or aluminum.

17. The magnetic storage device according to claim 13, wherein the fifth nonmagnetic body and the sixth nonmagnetic body each comprise at least one of ruthenium and iridium.

18. The magnetic storage device according to claim 7, wherein the first nonmagnetic body, the second nonmagnetic body, the third nonmagnetic body, and the fourth nonmagnetic body comprise magnesium oxide.

19. The magnetic storage device according to claim 7, further comprising:
   a first switching element connected in series with the first magnetoresistive effect element;
   a second switching element connected in series with the second magnetoresistive effect element;
   a third switching element connected in series with the third magnetoresistive effect element; and
   a fourth switching element connected in series with the fourth magnetoresistive effect element.

20. The magnetic storage device according to claim 19, wherein the first switching element, the second switching element, the third switching element, and the fourth switching element are each a two-terminal switch.

* * * * *